United States Patent
Noda et al.

(10) Patent No.: US 9,130,348 B2
(45) Date of Patent: Sep. 8, 2015

(54) TWO-DIMENSIONAL PHOTONIC CRYSTAL LASER

(75) Inventors: Susumu Noda, Kyoto (JP); Takui Sakaguchi, Kyoto (JP); Kazuya Nagase, Kawanishi (JP); Wataru Kunishi, Kyoto (JP); Eiji Miyai, Kyoto (JP); Yoshikatsu Miura, Kyoto (JP); Dai Ohnishi, Otsu (JP)

(73) Assignees: KYOTO UNIVERSITY, Kyoto (JP); ROHM CO., LTD., Kyoto (JP)

( * ) Notice: Subject to any disclaimer, the term of this patent is extended or adjusted under 35 U.S.C. 154(b) by 0 days.

(21) Appl. No.: 13/192,852

(22) Filed: Jul. 28, 2011

(65) Prior Publication Data

US 2012/0027038 A1    Feb. 2, 2012

(30) Foreign Application Priority Data

Jul. 30, 2010  (JP) ................................. 2010-171933
Jul. 30, 2010  (JP) ................................. 2010-171934
Jul. 30, 2010  (JP) ................................. 2010-171935

(51) Int. Cl.
    *H01S 5/00*    (2006.01)
    *H01S 5/12*    (2006.01)
    (Continued)

(52) U.S. Cl.
    CPC ............. *H01S 5/1231* (2013.01); *H01S 5/105* (2013.01); *H01S 5/187* (2013.01); *H01S 2301/17* (2013.01)

(58) Field of Classification Search
    CPC ... H01S 5/105; H01S 5/1231; H01S 2301/17; H01S 5/187; H01S 5/323
    USPC .......................................... 372/45.01, 50.124
    See application file for complete search history.

(56) References Cited

U.S. PATENT DOCUMENTS

| | | | |
|---|---|---|---|
| 5,843,590 A | 12/1998 | Miura et al. | |
| 2007/0201526 A1* | 8/2007 | Hori | 372/50.124 |
| 2007/0221867 A1* | 9/2007 | Beeson et al. | 250/487.1 |

(Continued)

FOREIGN PATENT DOCUMENTS

| | | |
|---|---|---|
| JP | A-2000-275418 | 10/2000 |
| JP | A-2000-332351 | 11/2000 |

(Continued)

OTHER PUBLICATIONS

Aug. 5, 2014 Office Action issued in Japanese Patent Application No. 2010-171933.
Aug. 5, 2014 Office Action issued in Japanese Patent Application No. 2010-171934.

*Primary Examiner* — Yuanda Zhang
(74) *Attorney, Agent, or Firm* — Oliff PLC

(57) ABSTRACT

A two-dimensional photonic crystal laser according to the present invention includes a two-dimensional photonic crystal layer 15 having a base body made of $Al_\alpha Ga_{1-\alpha} As$ ($0<\alpha<1$) or $(Al_\beta Ga_{1-\beta})_\gamma In_{1-\gamma} P$ ($0<=\beta<1$, $0<\gamma<1$) with modified refractive index areas (air holes) 151 periodically arranged therein and an epitaxial growth layer 16 created on the two-dimensional photonic crystal layer 15 by an epitaxial method. Since $Al_\alpha Ga_{1-\alpha} As$ and $(Al_\beta Ga_{1-\beta})_\gamma In_{1-\gamma} P$ are solid even at high temperatures, the air holes 151 will not be deformed in the process of creating the epitaxial growth layer 16, so that the performance of the two-dimensional photonic crystal layer 15 as a resonator can be maintained at high levels.

11 Claims, 19 Drawing Sheets

(51) Int. Cl.
*H01S 5/10* (2006.01)
*H01S 5/187* (2006.01)

(56) References Cited

U.S. PATENT DOCUMENTS

| | | | |
|---|---|---|---|
| 2007/0280318 A1* | 12/2007 | Yoshimoto et al. | 372/43.01 |
| 2009/0010298 A1* | 1/2009 | Kiyota | 372/96 |
| 2009/0074026 A1* | 3/2009 | Nagatomo et al. | 372/50.124 |
| 2009/0285255 A1* | 11/2009 | Sakai et al. | 372/50.124 |
| 2010/0142578 A1* | 6/2010 | Hoshino et al. | 372/45.01 |

FOREIGN PATENT DOCUMENTS

| | | |
|---|---|---|
| JP | A-2002-033549 | 1/2002 |
| JP | A-2006-156944 | 6/2006 |
| JP | A-2008-159684 | 7/2008 |
| JP | A-2009-038062 | 2/2009 |
| JP | A-2009-038063 | 2/2009 |
| JP | A-2010-109223 | 5/2010 |
| WO | WO 2006/062084 A1 | 6/2006 |

* cited by examiner

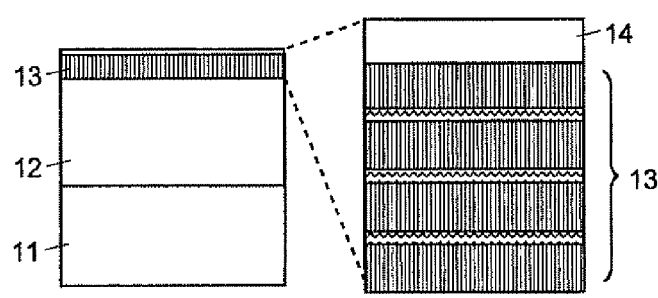
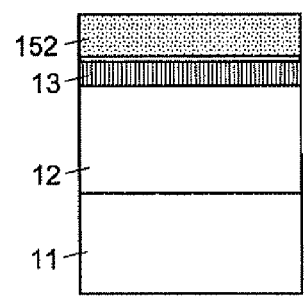
Fig. 3A    Fig. 3B
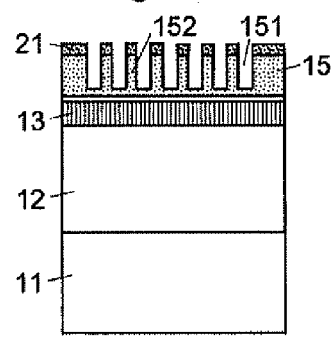
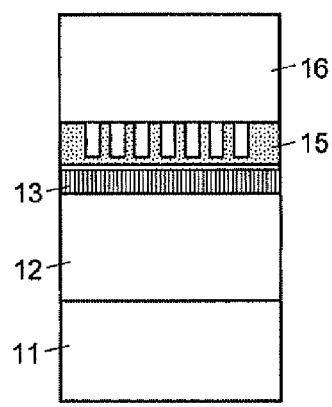
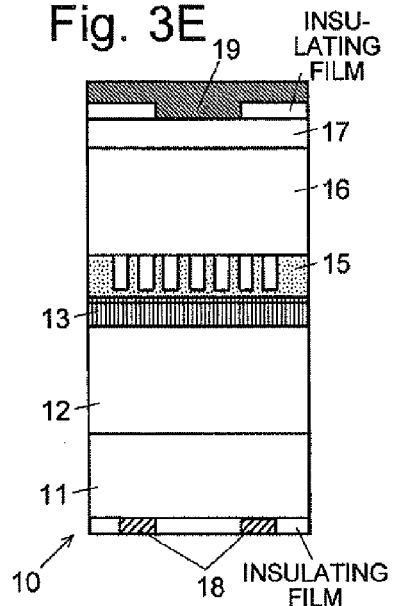
Fig. 3C    Fig. 3D    Fig. 3E
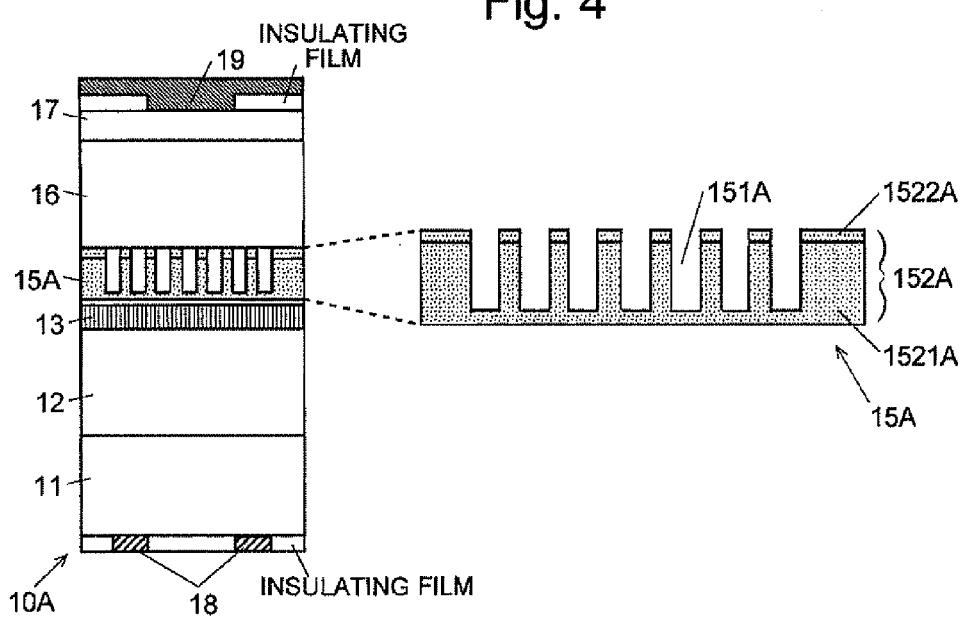
Fig. 4

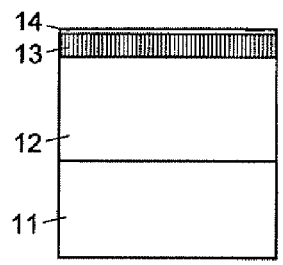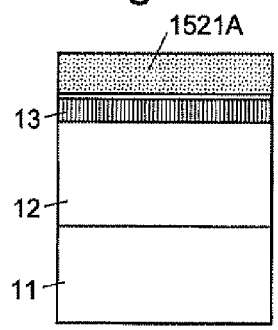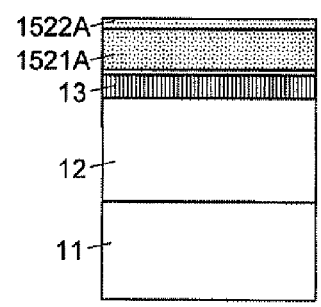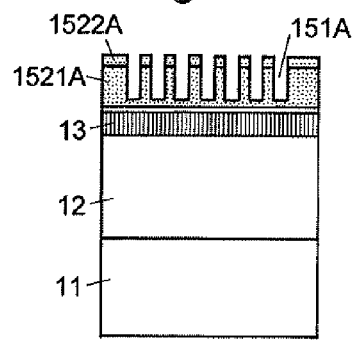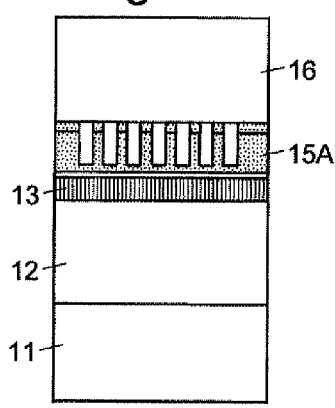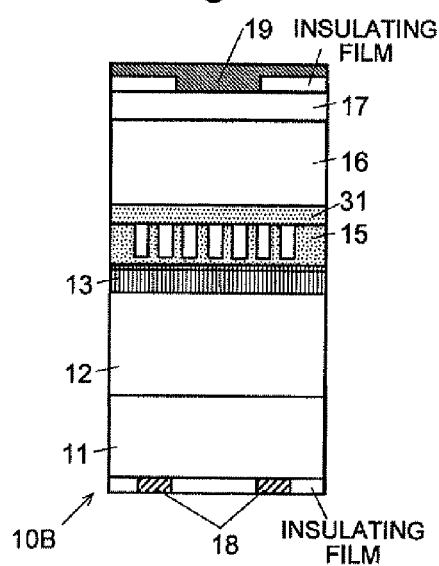

VERTICAL SECTION

HORIZONTAL SECTION

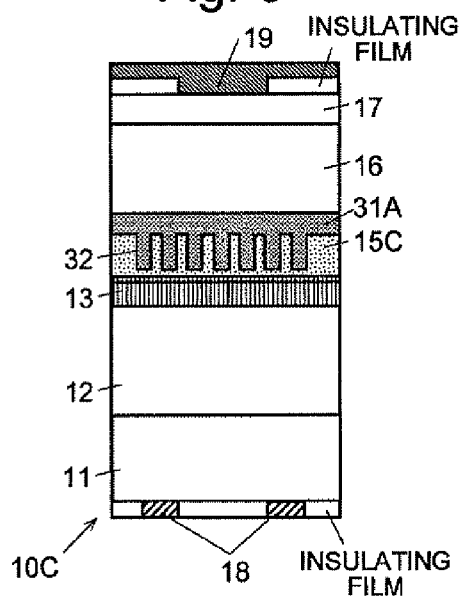
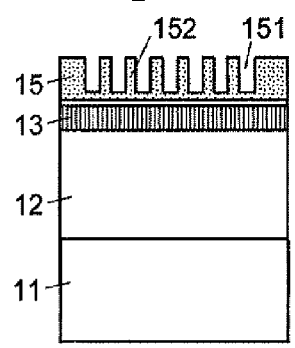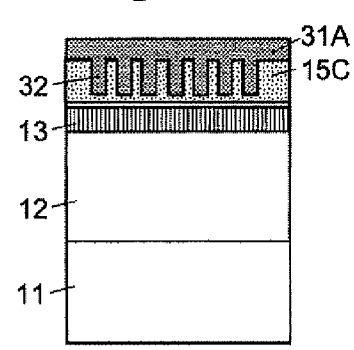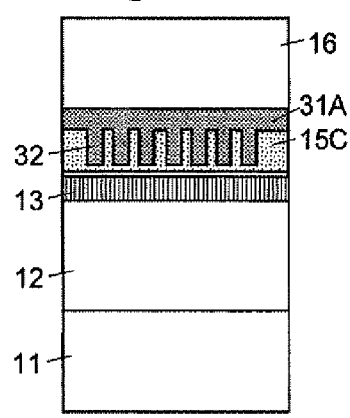

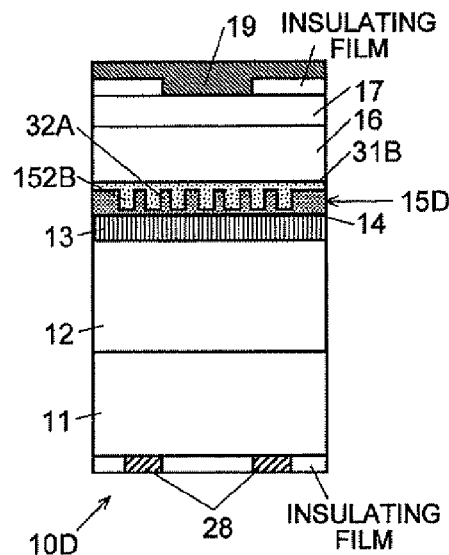
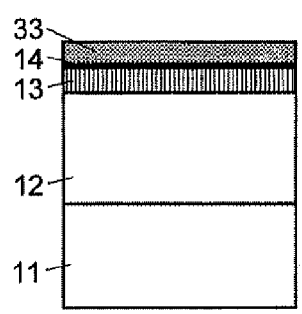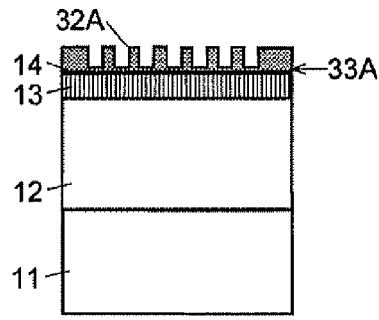
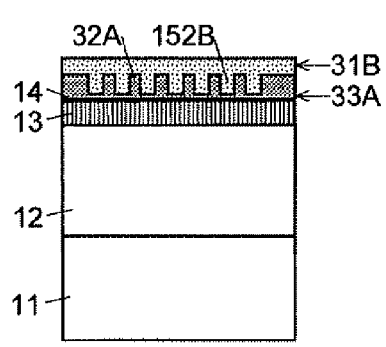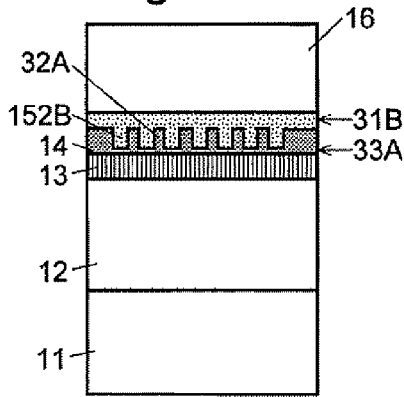

Fig. 13
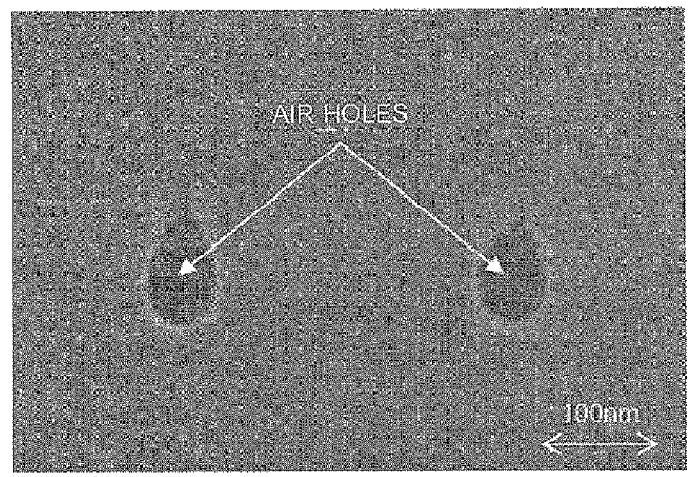
Fig. 14A
d=145nm, h/d=1.52
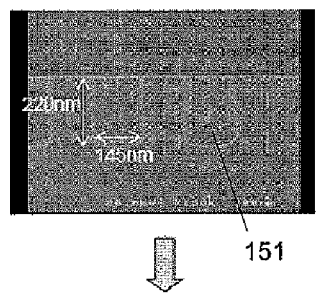
Fig. 14B
d=150nm, h/d=1.93
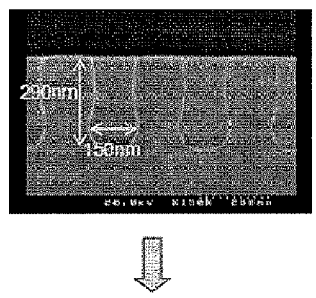
Fig. 14C
d=190nm, h/d=1.92
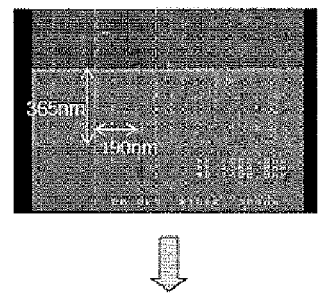
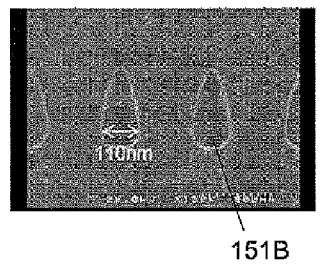
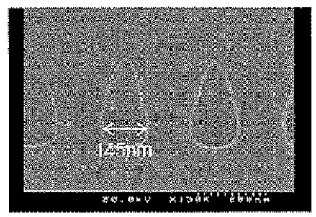
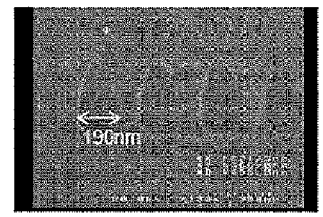

Fig. 16A
BEFORE REGROWTH
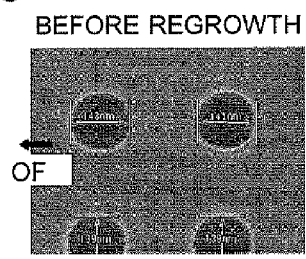
OF
Fig. 16B ⬇
AFTER REGROWTH TO 40nm
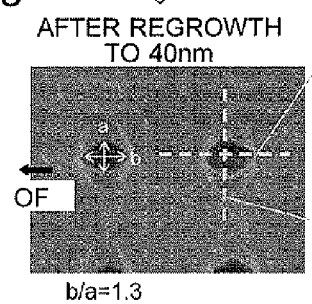
OF
b/a=1.3
OF: ORIENTATION FLAT
Fig. 16C
DIRECTION VERTICAL TO ORIENTATION-FLAT (011) FACE OF GaAs SUBSTRATE
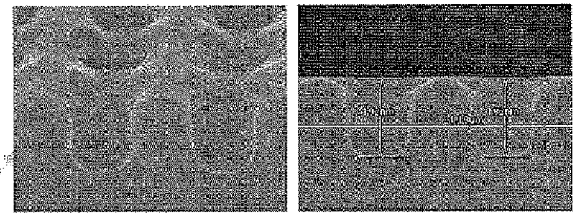
GROWTH RATE: LOW
Fig. 16D
DIRECTION PERPENDICULAR TO ORIENTATION-FLAT (011) FACE OF GaAs SUBSTRATE
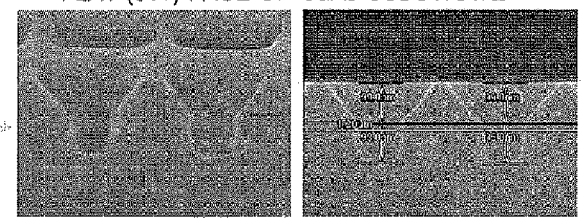
GROWTH RATE: HIGH
Fig. 16E
BEFORE REGROWTH          AFTER REGROWTH TO 40 nm
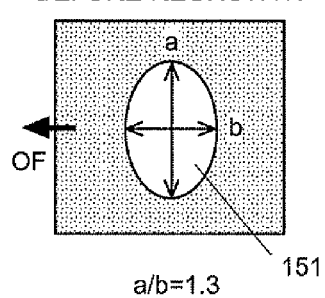 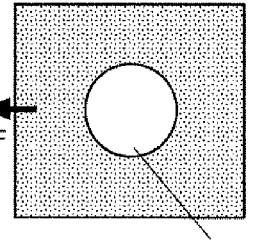
a/b=1.3   151         151B
OF: ORIENTATION FLAT

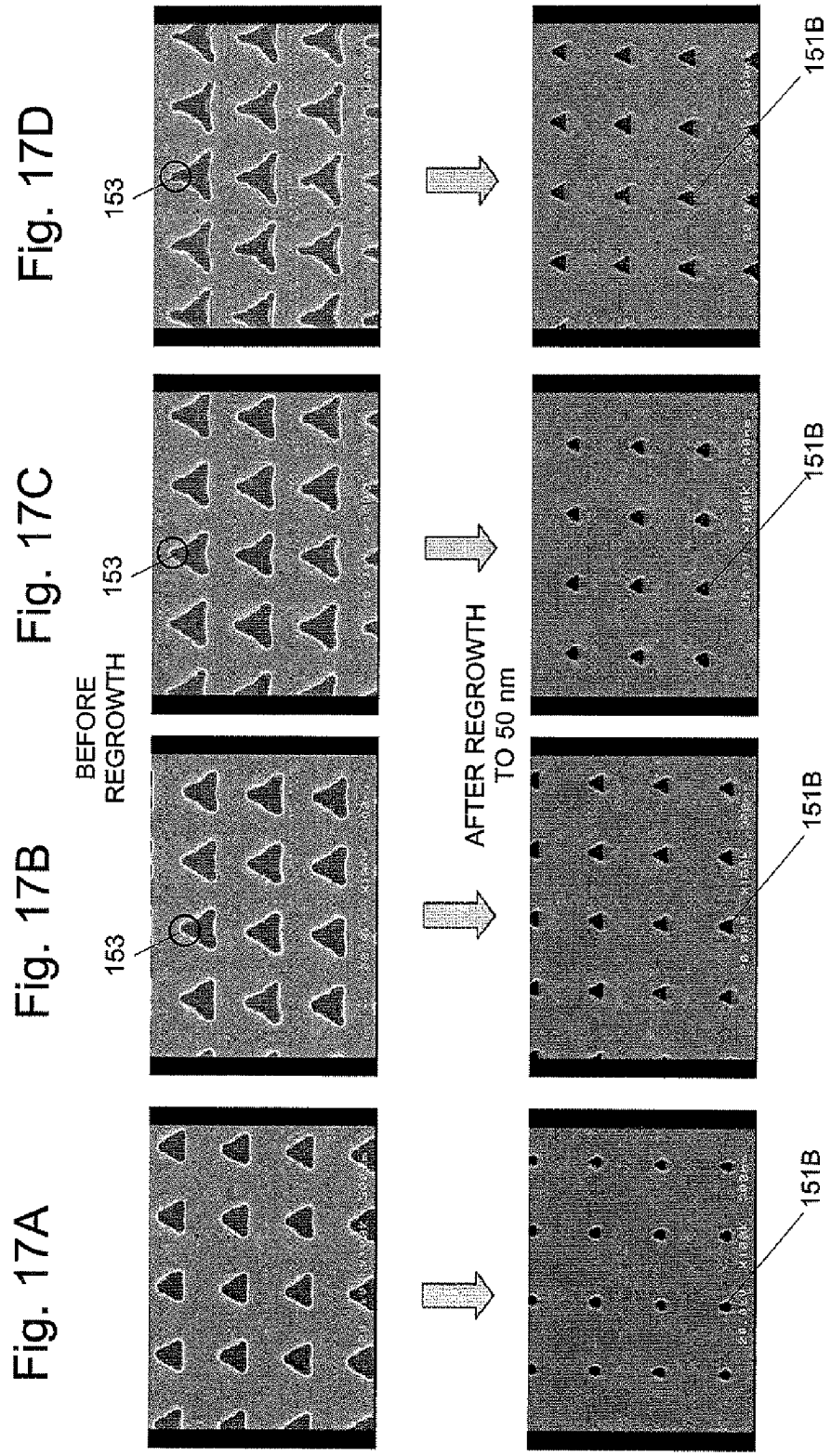

$1 < a/b \leq 1.5$ $2 < a/b \leq 3$

Fig. 23A
d=130nm, h=60nm, h/d=0.46
AFTER FORMATION
OF AIR HOLES
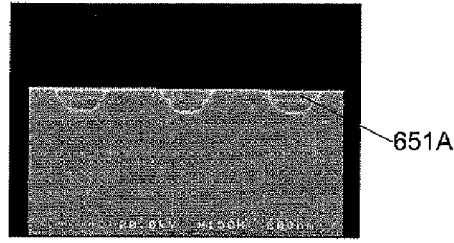
↘651A
⬇ 50 nm GROWTH OF
MODIFIED REFRACTIVE
INDEX AREAS
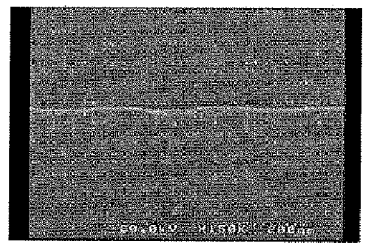
Fig. 23B
d=130nm, h=80nm, h/d=0.63
AFTER FORMATION
OF AIR HOLES
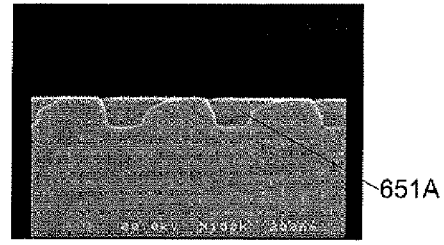
↘651A
⬇ 50 nm GROWTH OF
MODIFIED REFRACTIVE
INDEX AREAS
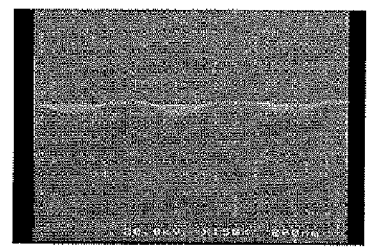

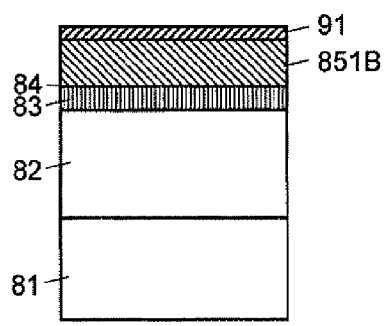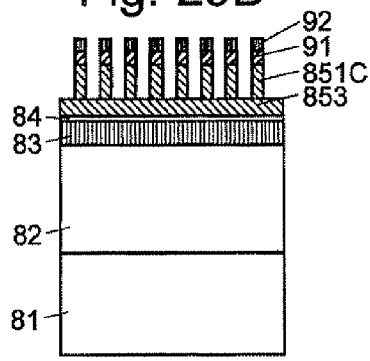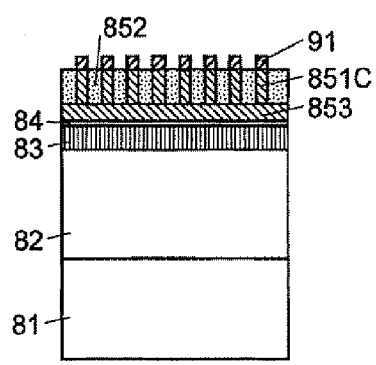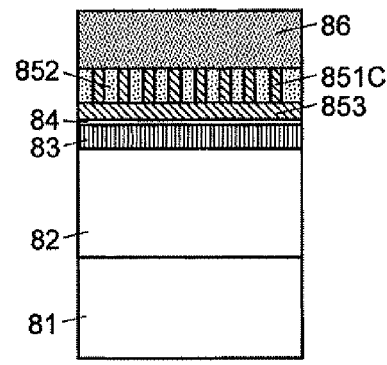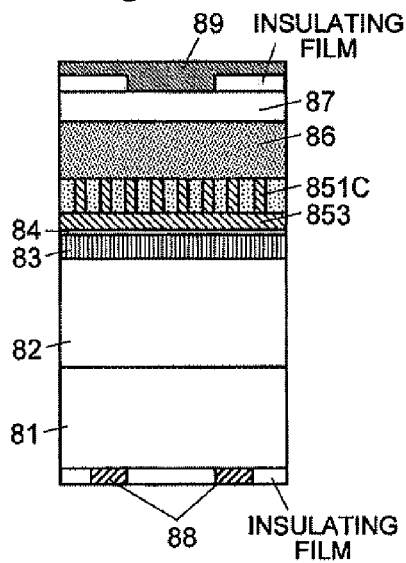

TWO-DIMENSIONAL PHOTONIC CRYSTAL LASER

TECHNICAL FIELD

The present invention relates to a two-dimensional photonic crystal laser having a structure suitable for a production process using an epitaxial method, as well as a method of producing such a laser.

BACKGROUND ART

In recent years, new types of lasers using a two-dimensional photonic crystal have been developed. A two-dimensional photonic crystal consists of a plate-shaped dielectric base body with a periodic structure of refractive index formed therein. Typically, this device is created by providing the base body with a periodic arrangement of areas whose refractive index differs from that of the base body. (This area is hereinafter called the "modified refractive index area.") This periodic structure causes a Bragg diffraction within the crystal and creates an energy band gap for the energy of light. There are two types of two-dimensional photonic crystal lasers: one type utilizes a band-gap effect to make a point defect function as a resonator, and the other type utilizes a standing wave at a band edge where the group velocity of light becomes zero. Each of these devices causes laser oscillation by amplifying light of a predetermined wavelength.

The latter type of the two-dimensional photonic crystal laser utilizing a standing wave has a layered structure in which a layer having a two-dimensional photonic crystal structure (this layer is hereinafter called the "two-dimensional photonic crystal layer") is stacked on an active layer either directly or via another layer. These layers are sandwiched by other layers, such as a cladding layer for injecting electric charges into the active layer, a contact layer to be in contact with an external element, and a spacer layer for connecting these layers.

Patent Document 1 discloses a method of creating a two-dimensional photonic crystal laser by a process including the following steps: a structure including a cladding layer, spacer layer and other layers is prepared; this structure is stacked on a two-dimensional photonic crystal layer consisting of a base body with air holes (modified refractive index areas) periodically arranged therein, with the spacer layer being in contact with the two-dimensional photonic crystal layer; and the two-dimensional photonic crystal layer and the spacer layer are fused together by heat (thermal fusion bonding). In one example disclosed in Patent Document 1, both the base body of the two-dimensional photonic crystal layer and the spacer layer are made of n-type InP, and the heating temperature is 620° C. The layer stacked on the two-dimensional photonic crystal layer is hereinafter referred to as the "upper layer."

Patent Document 2 discloses a method of creating an upper layer by epitaxially growing AlGaN directly on a two-dimensional photonic crystal layer consisting of a base body made of GaN with air holes periodically formed therein.

The methods described in Patent Document 2 can be broadly classified into the following three types: (i) A method in which a two-dimensional photonic crystal layer consisting of a base body with air holes as the modified refractive index areas periodically arranged therein is created, and then an upper layer is formed without filling the air holes; (ii) a method in which a layer including a base body with air holes periodically arranged therein is created, and then an upper layer is formed while filling the air holes to form modified refractive index areas; and (iii) a method in which modified refractive index areas in the form of columns are formed on a substrate, and then the spaces around them are filled by epitaxial growth to continuously form the base body and the upper layer.

In the case of the methods (ii) and (iii), the modified refractive index areas are made of a material other than air (more specifically, the same material as that of the upper layer). Such a structure has a lower light-confining effect as compared to the structure using air holes as the modified refractive index areas. However, the former structure is advantageous in that a single-mode laser oscillation can be more easily generated over a large area.

BACKGROUND ART DOCUMENT

Patent Document

Patent Document 1: JP-A 2000-332351
Patent Document 2: WO-A1 2006/062084

DISCLOSURE OF THE INVENTION

Problem to be Solved by the Invention

In the method described in Patent Document 1, the electric resistance at the interface between the two-dimensional photonic crystal layer and the upper layer increases due to an interface state at the fused faces of these layers. This increases the operating voltage and impedes the continuous oscillation of the laser. Furthermore, the thermal fusion bonding process may deform air holes and thereby deteriorate the performance of the two-dimensional photonic crystal layer as a resonator.

The methods described in Patent Document 2 are free from the problem of the increase in the electric resistance at the interface between the two-dimensional photonic crystal layer and the upper layer. However, in epitaxially growing the upper layer, the two-dimensional photonic crystal layer needs to be heated to 600° C. This urges atomic migrations and disturbs the atomic crystal structure in the two-dimensional photonic crystal layer, which results in a deformation of the holes. Such atomic migrations also disturbs the atomic arrays (or crystal structure) at the surface so that the upper layer epitaxially growing on the surface inherits disturbances in the atomic crystal structures.

Further, the method (i) has the problem that the material of the upper layer intrudes deeply into the air holes during the epitaxial growth of the upper layer, disfiguring the whole shape of the air holes. In the case of the methods (ii) and (iii), on the contrary, it is difficult to completely fill the air holes or the spaces between the columnar modified refractive index areas with the material of the upper layer, so that voids are likely to be formed. In any of these cases, the periodic structure of the refractive index becomes imperfect, which lowers the performance of the two-dimensional photonic crystal layer as a resonator and hence deteriorates the laser characteristics of the two-dimensional photonic crystal laser.

One of the problem solved by the present invention is, therefore, to provide a two-dimensional photonic crystal laser in which the two-dimensional photonic crystal layer is robust against high-temperature and adequately produces a sound upper epitaxial layer. Another problem solved by the present invention is to provide a method of producing a two-dimensional photonic crystal laser in which the epitaxial growth on the two-dimensional photonic crystal layer can be adequately controlled so that: in the case of producing the upper layer on a two-dimensional photonic crystal including holes, as in the above method (i), the upper layer material is prevented from intruding to the bottom of the holes, minimizing the disfigure of holes; in the case of producing a two-dimensional photonic crystal with modified refractive index areas made of the same material as the upper layer, as in the above method (ii), the holes in the base-body layer can be filled with the material of the upper layer with less voids; and in the case of producing a two-dimensional photonic crystal with a base-body layer made of the same material as the upper layer, as in the above method (iii), the base-body layer can be made with less voids.

Means for Solving the Problem (1) Means for Solving the First Problem

A two-dimensional photonic crystal laser according to the first aspect of the present invention aimed at solving the aforementioned first problem includes:

a two-dimensional photonic crystal layer having a base-body layer made of $Al_\alpha Ga_{1-\alpha}As$ ($0<\alpha<1$) or $(Al_\beta Ga_{1-\beta})_\gamma In_{1-\gamma}P$ ($0<=\beta<1$, $0<\gamma<1$) with modified refractive index areas periodically arranged therein; and an epitaxial growth layer created on the two-dimensional photonic crystal layer by an epitaxial method.

It should be noted that the terms "upper" and "lower" used in the present application merely indicate the positional relationship between layers and should not be interpreted as defining the direction of the layers with respect to the gravity during the manufacturing process or the direction of the completed two-dimensional photonic crystal laser with respect to the gravity.

As described before, in order to create an upper layer on the two-dimensional photonic crystal layer by an epitaxial method, it is necessary to heat the two-dimensional photonic crystal layer to as high as approximately 600° C. The material used in the first aspect of the present invention, i.e. $Al_\alpha Ga_{1-\alpha}As$ or $(Al_\beta Ga_{1-\beta})_\gamma In_{1-\gamma}P$, is solid even at such high temperatures and atomic migrations hardly occur. Therefore, in the case of epitaxially growing an upper layer on a base-body layer having a hole or holes (as in the case of two-dimensional photonic crystal with air holes), the air hole or air holes hardly deform in the epitaxially growing process. Also in the case of forming a two-dimensional photonic crystal with the modified refractive index areas made of the material of the upper layer, the holes in the base-body layer hardly deform. In any case, the performance of the two-dimensional photonic crystal layer as a resonator can be maintained at high levels. Further, since the atomic crystal structure of the base-body layer is less disturbed due to atomic migrations at such high temperature, the upper layer epitaxially growing on the base-body layer bears less disturbances in the atomic crystal structures in the first aspect of the present invention.

As the material for the epitaxial growth layer, $Al_xGa_{1-x}As$ ($0<x<1$) is desirable. The gas-diffusion length of $Al_xGa_{1-x}As$ varies according to the content of Al, and its growth characteristic correspondingly changes. Therefore, it is possible to maintain the performance of the two-dimensional photonic crystal layer as a resonator at high levels by optimizing the value of x according to the structure of the lower layer, i.e. the photonic crystal layer.

The epitaxial growth layer can be used, without any change, as a p-type or n-type cladding layer in a light-emitting diode (LED). However, it is also possible to use the epitaxial growth layer as a regrowth interface layer for separately forming a cladding layer by epitaxial growth. When the parameter x is changed according to the structure of the photonic crystal layer in the aforementioned manner, if the epitaxial growth layer is used as the cladding layer without any change, the composition of the cladding layer will also change according to the structure of the photonic crystal layer. The introduction of the regrowth interface layer allows the creation of a cladding layer independently of the structure of the photonic crystal layer. Therefore, the two-dimensional photonic crystal laser can be produced with higher degrees of freedom in its structure.

(2) Method for Solving the Second Problem

The second aspect of the present invention achieved to solve the second problem described above has the following three modes. Any of the three modes correspond to the two-dimensional photonic crystal laser as the above-described first aspect wherein the base body is made of $Al_\alpha Ga_{1-\alpha}As$ and the value of x is limited to a specific range.

(2-1) First Mode of the Method of Producing Two-Dimensional Photonic Crystal Laser According to the Second Aspect of the Present Invention The first mode of the method of producing a two-dimensional photonic crystal laser according to the present invention includes:

a) a base-body layer creation process for creating a base-body layer having a same crystal structure as $Al_xGa_{1-x}As$ ($0.4<=x<1$);

b) an air-hole formation process for periodically forming air holes in the base-body layer, each of the air holes having a maximum width d in planer shape and a depth h, where d satisfies $d<=200$ nm and a depth-to-width ratio h/d satisfies $1.3<=h/d<=5$; and c) an epitaxial-layer creation process for creating a layer made of the aforementioned $Al_xGa_{1-x}As$ on the base-body layer and the air holes by an epitaxial method.

The "maximum width" in the present application is defined as the length of the longest line segment that can be included in the planer shape of the air hole (i.e. the sectional shape of the air hole parallel to the surface of the base-body layer). For example, when the planer shape of the air hole is circular, the diameter of the circle corresponds to the maximum width. For an elliptic hole, the major diameter of the ellipse corresponds to the maximum width. For a triangular hole, the longest side of the triangle equals the maximum width.

In the first-mode method, the vertical sectional shape (the sectional shape vertical to the surface of the base-body layer) and planer shape of the air holes in the two-dimensional photonic crystal layer before epitaxial growth are determined based on the growth characteristics of $Al_xGa_{1-x}As$ so as to make the shape of the air holes after the regrowth as close to the desired shape as possible and thereby maintain the performance of the crystal layer as a photonic crystal at high levels. Specifically, the ratio of the depth h to the maximum width d of the air hole, h/d, (which is hereinafter referred to as the "aspect ratio") is set to be 1.3 or greater. This setting is aimed at giving the air holes an adequate depth so that a large quantity of the material used for creating the epitaxial layer (upper layer) will not enter to the bottom and fill the air holes in the epitaxial-layer creation process. Setting the parameter x to be a large value equal to or greater than 0.4 is also aimed at preventing the material of the upper layer from entering the air holes. This is based on the fact that the gas-diffusion length of the materials belonging to the $Al_xGa_{1-x}As$ group decreases as the value of x increases. The values of h/d and x are appropriately adjusted within the aforementioned ranges so that the shape of the air hole after the regrowth becomes as close to the desired shape as possible. In this manner, a two-dimensional photonic crystal laser with high laser characteristics can be created without deteriorating the performance of the two-dimensional photonic crystal layer as a resonator.

If the depth h is too large or the maximum width d is too small, the two-dimensional periodic structure may become insufficient. This situation can be avoided by setting an upper limit of the aspect ratio h/d, which is 5 in the first-mode method.

In the first-mode method, a process for forming a crystal-growth inhibiting film for inhibiting an epitaxial growth of $Al_xGa_{1-x}As$ on at least a portion of the inner surface of the air holes may be added between the air-hole formation process and the epitaxial-layer creation process. This film will more assuredly inhibit the formation of the crystal of $Al_xGa_{1-x}As$ inside the air holes. Examples of the materials available for the crystal-growth inhibiting film include silicon dioxide ($SiO_2$), silicon nitride ($Si_3N_4$), zinc oxide (ZnO) and zirconium dioxide ($ZrO_2$).

When a film is formed by crystal growth, the film anisotropically grows at different rates in the in-plane direction (i.e. the direction parallel to the surface of the substrate) depending on the direction of the flow of the material gas used in the production process or other factors. Therefore, if the layer above the base-body layer and the air holes is formed by an epitaxial method, the air holes will change their shapes depending on the difference in the growth rate. Given this problem, in the first-mode method, it is desirable to investigate the difference in the growth rate by a preliminary experiment or other the like and design the planer shapes of the air holes before the creation of the upper layer (epitaxial layer) in accordance with that difference. By this method, the planer shape of the air holes after the creation of the epitaxial layer can be made to be close to the desired shape.

(2-2) Second Mode of the Method of Producing Two-Dimensional Photonic Crystal Laser According to the Second Aspect of the Present Invention The second mode of the method of producing a two-dimensional photonic crystal laser according to the present invention includes:

a) a base-body layer creation process for creating a base-body layer having a same crystal structure as $Al_xGa_{1-x}As$ ($0<x<=0.8$);

b) an air-hole formation process for periodically forming air holes in the base-body layer, each of the air holes having a maximum width d in planer shape and a depth h, where d satisfies d<=200 nm and a depth-to-width ratio h/d satisfies 0.1<=h/d<=1.2;

c) a modified refractive index area formation process for forming, by an epitaxial method, modified refractive index areas made of the aforementioned $Al_xGa_{1-x}As$ in the air holes; and d) an epitaxial-layer creation process for creating, by the aforementioned epitaxial method, a layer made of $Al_yGa_{1-y}As$ ($0<=y<=1$) on the base-body layer having the modified refractive index areas formed therein.

In the second-mode method, the aspect ratio h/d, which satisfies 0.1<=h/d<=1.2, is smaller than the values used in the first-mode method. Furthermore, the parameter x has a relatively small value of 0.8 or less. These settings are aimed at making the air holes easy to be filled with the material of the modified refractive index areas, i.e. $Al_xGa_{1-x}As$. Filling the air holes with this material effectively suppresses the formation of voids in the modified refractive index areas and thereby prevents deterioration in the performance of the two-dimensional photonic crystal layer as a resonator. As a result, a two-dimensional photonic crystal laser with high laser characteristics is obtained.

(2-3) Third Mode of the Method of Producing Two-Dimensional Photonic Crystal Laser According to the Second Aspect of the Present Invention The third mode of the method of producing a two-dimensional photonic crystal laser according to the present invention includes:

a) a modified refractive index area formation process for periodically forming columnar modified refractive index areas on an epitaxial-growth substrate layer having a same crystal structure as $Al_xGa_{1-x}As$ ($0<x<=0.65$), the modified refractive index areas being made of a material whose refractive index differs from that of the aforementioned $Al_xGa_{1-x}As$;

b) a base-body creation process for creating, by an epitaxial method, a base body made of the aforementioned $Al_xGa_{1-x}As$ in a space between the modified refractive index areas; and c) an epitaxial-layer creation process for creating, by the aforementioned epitaxial method, a layer made of $Al_yGa_{1-y}As$ ($0<=y<=1$) on a layer in which the modified refractive index areas and the base body have been formed.

In the third-mode method, columnar modified refractive index areas are initially formed, after which a base body is formed by filling the spaces around the modified refractive index areas with $Al_xGa_{1-x}As$. The base body formed by filling the spaces with $Al_xGa_{1-x}As$ is less likely to allow the formation of voids than the modified refractive index areas formed by filling air holes with $Al_xGa_{1-x}As$, and hence will not cause deterioration in the performance of the two-dimensional photonic crystal layer as a resonator. As a result, a two-dimensional photonic crystal laser with high laser characteristics is obtained. The material of the epitaxial-growth substrate layer may be the same as or different from the material used for forming the base body or the modified refractive index areas.

Effects of the Invention

In the two-dimensional photonic crystal laser according to the first aspect of the present invention, a material selected from the group of $Al_\alpha Ga_{1-\alpha}As$ or $(Al_\beta Ga_{1-\beta})_\gamma In_{1-\gamma}P$, which is solid even at high temperatures, is used for the base body. Therefore, the air holes will not be deformed in the process of epitaxially growing the upper layer, so that the performance of the two-dimensional photonic crystal layer as a resonator can be maintained at high levels.

In the two-dimensional photonic crystal laser according to the present invention, when the epitaxial growth layer serving as the upper layer is made of $Al_xGa_{1-x}As$, the performance of the two-dimensional photonic crystal layer as a resonator can be maintained at even higher levels. Furthermore, in the two-dimensional photonic crystal laser according to the present invention, when the epitaxial growth layer is used as a regrowth interface layer for creating a p-type or n-type cladding layer by epitaxial growth, the two-dimensional photonic crystal laser can be produced with higher degrees of freedom in its structure.

In the first mode of the method of producing a two-dimensional photonic crystal laser according to the second aspect of the present invention, the entry of the material of the epitaxial layer into the air holes of the two-dimensional photonic crystal layer is prevented by giving a high aspect ratio to the air holes before epitaxial growth and using $Al_xGa_{1-x}As$ ($0.4<=x<1$) which barely diffuses to the bottom of the holes in the process of epitaxial growth. As a result, the shape of the air hole after the regrowth becomes close to the desired shape, whereby the performance of the crystal layer as a photonic crystal is maintained at high levels. In this manner, a two-dimensional photonic crystal laser with high laser characteristics can be created without deteriorating the performance of the two-dimensional photonic crystal layer as a resonator.

In the second and third modes of the method of producing a two-dimensional photonic crystal laser according to the second aspect of the present invention, as described previously, the inside of the air holes (second mode) or the spaces between the modified refractive index areas (third mode) can be easily filled with $Al_xGa_{1-x}As$. Therefore, it is possible to create the two-dimensional photonic crystal layer with no void formed in the air holes or in the spaces between the modified refractive index areas, whereby the performance of the two-dimensional photonic crystal as a resonator is prevented from deterioration. As a result, a two-dimensional photonic crystal laser with high laser characteristics is obtained.

BRIEF DESCRIPTION OF THE DRAWINGS

FIGS. 3A-3E are vertical sectional views showing a method of producing the two-dimensional photonic crystal laser of Embodiment 1.

FIG. 4 is a vertical sectional view showing the second embodiment (Embodiment 2) of the two-dimensional photonic crystal laser according to the present invention.

FIGS. 5A-5E are vertical sectional views showing a method of producing the two-dimensional photonic crystal laser of Embodiment 2.

FIG. 6 is a vertical sectional view showing the third embodiment (Embodiment 3) of the two-dimensional photonic crystal laser according to the present invention.

FIG. 9 is a vertical sectional view showing the fourth embodiment (Embodiment 4) of the two-dimensional photonic crystal laser according to the present invention.

FIGS. 10A-10C are vertical sectional views showing a method of producing the two-dimensional photonic crystal laser of Embodiment 4.

FIG. 11 is a vertical sectional view showing the fifth embodiment (Embodiment 5) of the two-dimensional photonic crystal laser according to the present invention.

FIGS. 12A-12D are vertical sectional views showing a method of producing the two-dimensional photonic crystal laser of Embodiment 5.

FIG. 13 is an electron microscopic image showing a vertical sectional shape of air holes formed in a two-dimensional photonic crystal layer created by regrowing the upper layer by a conventional epitaxial method.

FIGS. 14A-14C are images each of which shows a change in the vertical sectional shape of air holes before and after the formation of an epitaxial layer.

FIGS. 16A-16E are images and diagrams showing a change in the horizontal sectional shape of air holes having a circular planer shape before and after the formation of an epitaxial layer.

FIGS. 17A-17D are images each of which shows a change in the horizontal sectional shape of air holes having a equilateral-triangular planer shape before and after the formation of an epitaxial layer.

FIGS. 23A and 23B are microscopic images each of which shows one example of the air holes filled with the material of the modified refractive index areas by a method of Embodiment 8.

FIGS. 29A-29E are vertical sectional views showing one embodiment (Embodiment 13) of the third mode of the method of producing a two-dimensional photonic crystal laser.

BEST MODES FOR CARRYING OUT THE INVENTION

Embodiments of the two-dimensional photonic crystal laser and the first through third modes of the method of producing a two-dimensional photonic crystal laser according to the present invention are hereinafter described by means of FIGS. 1-29E. Among the following embodiments, Embodiments 1-5 are examples of the two-dimensional photonic crystal laser according to the present invention, Embodiments 6 and 7 are examples of the first mode of the method of producing a two-dimensional photonic crystal laser, Embodiments 8-10 are examples of the second mode of the method of producing a two-dimensional photonic crystal laser, and Embodiments 11-13 are examples of the third mode of the method of producing a two-dimensional photonic crystal laser.

Embodiment 1

Figure 1:
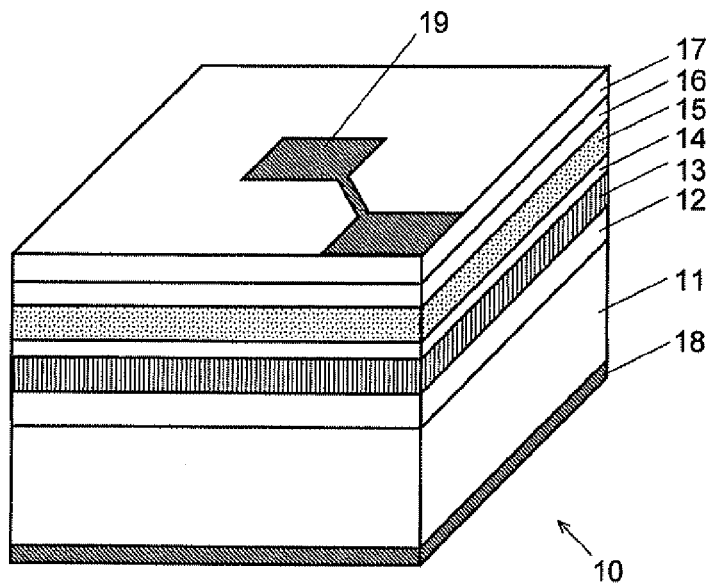
FIG. 1 is a perspective view showing the first embodiment (Embodiment 1) of the two-dimensional photonic crystal laser according to the present invention.

As shown in FIG. 1, the two-dimensional photonic crystal laser 10 of Embodiment 1 includes a substrate 11, on which a first cladding layer 12, an active layer 13, a carrier-blocking layer 14, a two-dimensional photonic crystal layer 15, a second cladding layer (epitaxial growth layer) 16 and a contact layer 17 are stacked in this order. A lower electrode 18 is provided under the substrate 11, while an upper electrode 19 is provided on the contact layer 17.

Figure 2:
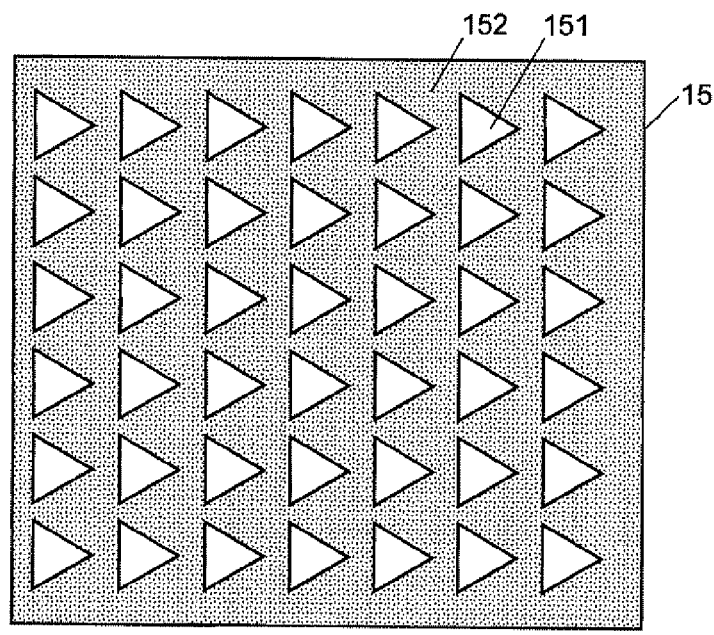
FIG. 2 is a top view showing one example of the structure of the two-dimensional photonic crystal layer.
Figure 7A:
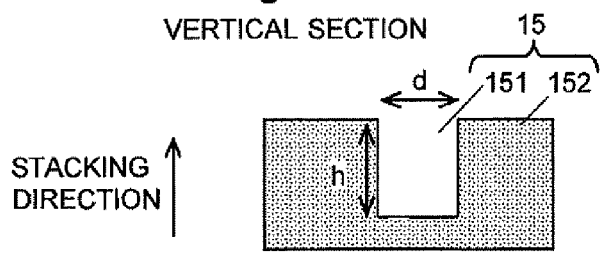
FIGS. 7A and 7B are diagrams for illustrating the depth h and the maximum width d of an air hole.
Figure 7B:
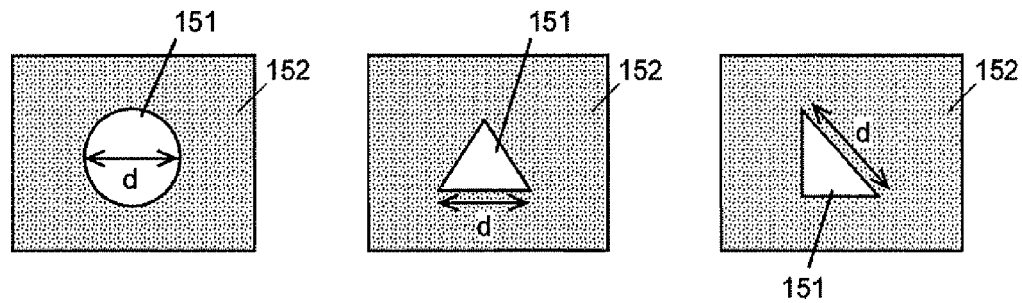

As shown in FIG. 2, the two-dimensional photonic crystal layer 15 consists of a plate-shaped base-body layer 152 in which air holes 151 having a specific planer shape, such as a circle or triangle, are periodically formed. In the present embodiment, $Al_{0.1}Ga_{0.9}As$ is used as the material of the base-body layer 152. This is because $Al_{0.1}Ga_{0.9}As$ is solid even at high temperatures and can prevent deformation of the air holes 151 even if the temperature is increased to create the second cladding layer 16 by an epitaxial method as described later.

It should be noted that the material of the base-body layer 152 is not limited to the one used in the present embodiment; any material selected from the group of $Al_\alpha Ga_{1-\alpha}As$ ($0<\alpha<1$) or $(Al_\beta Ga_{1-\beta})_\gamma In_{1-\gamma}P$ ($0<=\beta<1$, $0<\gamma<1$) may be used. The former group is suitable for producing a laser oscillation having a wavelength within the near-infrared region. The latter group is suitable for producing a laser oscillation having a wavelength within the red region.

For the second cladding layer 16, a material that can form a layer on the two-dimensional photonic crystal layer 15 by an epitaxial method is used. The material used for the second cladding layer 16 in the present embodiment is p-type $Al_{0.65}Ga_{0.35}As$, which includes a triply-charged positive ($Al_{0.65}Ga_{0.35}$) site doped with a minor amount of doubly-charged positive impurity. It should be noted that the material of the second cladding layer 16 is not limited to the one used in the present embodiment; any material categorized as p-type $Al_x Ga_{1-x}As$ ($0.4<=x<1$) can be suitably used. As the value of x increases, the gas-diffusion length of $Al_x Ga_{1-x}As$ decreases, making this material more difficult to enter the air holes 151, Accordingly, it is possible to prevent the formation of an unnecessary crystal of p-type $Al_{0.65}Ga_{0.35}As$ inside the air holes 151.

For the layers other than the two-dimensional photonic crystal layer 15 and the second cladding layer 16, the following materials are used in the present embodiment: For the substrate 11 and the first cladding layer 12, n-type GaAs and n-type $Al_{0.65}Ga_{0.35}As$ are used, respectively. These materials can be obtained by doping the Ga site of GaAs or ($Al_{0.65}Ga_{0.35}$) site of $Al_{0.65}Ga_{0.35}As$ with a minor amount of quadruply-charged positive impurity. The active layer 13 is made of InGaAs/GaAs multiple quantum wells. The carrier-blocking layer 14 is made of $Al_{0.4}Ga_{0.6}As$. The contact layer 17 is made of p-type GaAs. It should be noted that these layers may also be made of materials other than the aforementioned ones.

Opposite to the present embodiment, it is also possible to use p-type materials for the substrate 11 and the first cladding layer 12 and n-type materials for the second cladding layer 16 and the contact layer 17.

One example of the method of producing the two-dimensional photonic crystal laser 10 of the present embodiment is hereinafter described by means of FIGS. 3A-3E. It should be noted that, unlike the previously described first and second modes of the method of producing a two-dimensional photonic crystal laser, there is no specific limitation on the aspect ratio of the air holes in the present embodiment. First, the first cladding layer 12, the active layer 13 and the carrier-blocking layer 14 are created in this order on the substrate 11 by epitaxially growing each layer by a gas-phase process (FIG. 3A). Next, the base-body layer 152 is created by epitaxially growing it on the carrier-blocking layer 14 by a gas-phase process (FIG. 3B). Subsequently, a resist 21 is applied to the top surface of the base-body layer 152, and a pattern corresponding to the arrangement of air holes 151 is formed in the resist 21 by electron beam lithography, after which the air holes 151 are formed in the base-body layer 152 by etching. As a result, the two-dimensional photonic crystal layer 15 is obtained (FIG. 3C).

After that, the resist 21 is removed, and the second cladding layer 16 is created by epitaxially growing it on the two-dimensional photonic crystal layer 15 by a gas-phase process (FIG. 3D). During the process of epitaxially growing the second cladding layer 16, the two-dimensional photonic crystal layer 15 is heated to approximately 600° C. If the base-body layer 152 is made of GaAs with no Al contained therein and heated to such a high temperature, atomic migration may occur, causing the disfiguring of the air holes 151. In the present embodiment, the use of $Al_{0.1}Ga_{0.9}As$ as the material of the base-body layer 152 enables the air holes 151 to maintain their shape even at such a high temperature.

After the second cladding layer 16 is created, the contact layer 17 is epitaxially grown on the second cladding layer 16 by a gas-phase process. Then, the lower and upper electrodes 18 and 19 are respectively created under the substrate 11 and on the contact layer 17 by vapor deposition to obtain the two-dimensional photonic crystal laser 10 of the present embodiment (FIG. 3E).

Embodiment 2

Embodiment 2 of the two-dimensional photonic crystal laser according to the present invention is hereinafter described by means of FIG. 4. In the two-dimensional photonic crystal laser 10A of the present embodiment, a two-dimensional photonic crystal layer 15A, which will be described later, is used in place of the two-dimensional photonic crystal layer 15 used in Embodiment 1. The other elements are the same as those of the two-dimensional photonic crystal laser 10 of Embodiment 1.

The two-dimensional photonic crystal layer 15A has a base-body layer 152A having a double-layer structure including a first base-body layer 1521A made of $Al_{0.65}Ga_{0.35}As$ ($\alpha=0.65$) on which a second base-body layer 1522A made of $Al_{0.1}Ga_{0.9}As$ ($\alpha=0.1$) is formed. The second base-body layer 1522A is thinner than the first one 1521A. Air holes 151A having the same shape and space intervals as in Embodiment 1 are formed in the base-body layer 152A. The second base-body layer 1522A is characterized in that it has an Al content lower than that of the first base-body layer 1521A and therefore is less likely to be oxidized in the production process described later.

A method of producing the two-dimensional photonic crystal laser 10A of the present embodiment is hereinafter described by means of FIGS. 5A-5E. It should be noted that the present embodiment also imposes no specific limitation on the aspect ratio of the air holes. First, similarly to the method of Embodiment 1, the first cladding layer 12, the active layer 13 and the carrier-blocking layer 14 are created in this order on the substrate 11 by epitaxially growing each layer by a gas-phase process (FIG. 5A). Next, the first base-body layer 1521A is created by epitaxially growing it on the carrier-blocking layer 14 by a gas-phase process (FIG. 5B). Subsequently, the second base-body layer 1522A is created by epitaxially growing it on the first base-body layer 1521A by a gas-phase process (FIG. 5C). All of these processes are performed in the same chamber while changing the type of the material gas.

Next, similarly to Embodiment 1, air holes 151A are formed in the base-body layer 152A by electron beam lithography and etching (FIG. 5D). This process use techniques different from epitaxy and hence needs to be performed in a chamber different from the chamber used for the previous processes. Subsequently, the chamber is replaced with the previously used one, and the second cladding layer 16 is created by epitaxially growing it on the second base-body layer 1522A by a gas-phase process (FIG. 5E). After that, the contact layer 17, the lower electrode 18 and the upper electrode 19 are created by a method similar to Embodiment 1 to obtain the two-dimensional photonic crystal laser 10A of the present embodiment.

As just described, the present method requires changing the chamber before and after the process of forming the air holes 151A. In the process of changing the chamber, the surface of the base-body layer may be oxidized. In the present embodiment, this oxidation of the surface of the base-body layer is suppressed by the second base-body layer 1522A made of a material that is more resistant to oxidation than the material of the first base-body layer 1521A.

Embodiment 3

Embodiment 3 of the two-dimensional photonic crystal laser according to the present invention is hereinafter described by means of FIG. 6. The two-dimensional photonic crystal laser 10B of the present embodiment is created by the first mode of the method of producing a two-dimensional photonic crystal laser.

The two-dimensional photonic crystal laser 10B is a variation of the device described in Embodiment 1 and additionally includes a regrowth interface layer 31 made of $Al_xGa_{1-x}As$ ($0.4<=x<1$) located between the two-dimensional photonic crystal layer 15 and the second cladding layer 16. The maximum width d in planer shape of the air hole 151 is equal to or smaller than 200 nm. The ratio of the depth h to the maximum width d of the air hole 151 (the aspect ratio h/d) satisfies $1.3<=h/d<=5$. The maximum width d corresponds to the length of the longest line segment that can be included in the planer shape of the air hole 151 (see FIGS. 7A and 7B). For example, when the air hole 151 has a circular planer shape, its diameter corresponds to the maximum width. For an air hole having an equilateral-triangular planer shape, its one-side length corresponds to the maximum width. For a non-equilateral triangle, the length of the longest side of the triangle equals the maximum width.

In the present embodiment, the material gas for creating the regrowth interface layer 31 is prevented from easily entering the air hole 151 by giving a relatively high value to the Al content x of the regrowth interface layer 31 and setting the aspect ratio h/d to be equal to or higher than 1.3. Therefore, a crystal of the material used for the regrowth interface layer 31 will be barely formed in the air holes 151. The reason for setting an upper limit of the aspect ratio h/d, which is 5 in the present case, is because the two-dimensional periodic structure of the air holes 151 may become insufficient if h is too large or d is too small.

A method of producing the two-dimensional photonic crystal laser 10B of the present embodiment is hereinafter described by means of FIGS. 8A-8C. Other examples of the first mode of the method of producing a two-dimensional photonic crystal laser will be described in more detail in Embodiments 6 and 7.

Figure 8A:
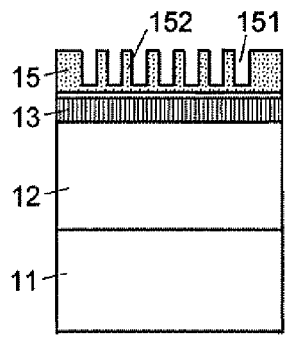
FIGS. 8A-8C are vertical sectional views showing a method of producing the two-dimensional photonic crystal laser of Embodiment 3.
Figure 8B:
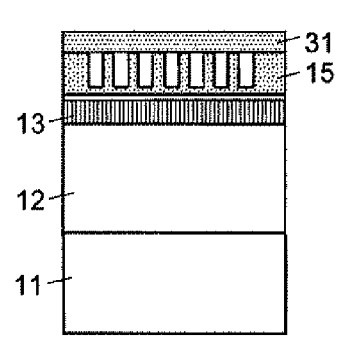
Figure 8C:
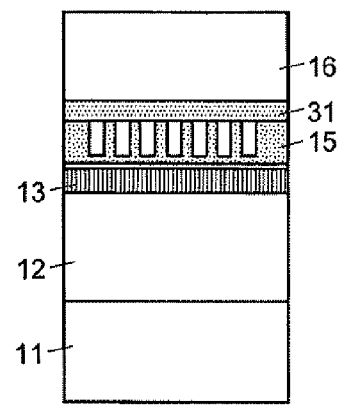

First, the first cladding layer 12, the active layer 13, the carrier-blocking layer 14 and the two-dimensional photonic crystal layer 15 are created on the substrate 11 by a method similar to Embodiment 1 (FIG. 8A). Next, the regrowth interface layer 31 is created by epitaxially growing it on the two-dimensional photonic crystal layer 15 by a gas-phase process to close the upper side of the air holes 151 (FIG. 8B). In this process, as already explained, the material of the regrowth interface layer 31 is prevented from entering the air holes 151. Furthermore, the aforementioned choice of the material for the base-body layer 152 prevents the occurrence of atomic migration in this process. Subsequently, the second cladding layer 16 is created by epitaxially growing it on the regrowth interface layer 31 by a gas-phase process (FIG. 8C). After that, the contact layer 17, the lower electrode 18 and the upper electrode 19 are created by a method similar to Embodiment 1 to obtain the two-dimensional photonic crystal laser 10B of the present embodiment.

Embodiment 4

Embodiment 4 of the two-dimensional photonic crystal laser according to the present invention is hereinafter described by means of FIG. 9. The two-dimensional photonic crystal laser 10C of the present embodiment is created by the second mode of the method of producing a two-dimensional photonic crystal laser.

In the two-dimensional photonic crystal laser 10C, a regrowth interface layer 31A made of $Al_xGa_{1-x}As$ ($0<x<=0.8$) is provided in place of the regrowth interface layer 31 used in Embodiment 3. Furthermore, in place of the air holes 151, modified refractive index members 32 made of the same material as that of the regrowth interface layer 31A are periodically arranged in the two-dimensional photonic crystal layer 15C. The maximum width d in planer shape of the modified refractive index member 32 is equal to or smaller than 200 nm. The aspect ratio h/d is set to satisfy $0.1<=h/d<=1.2$. The definitions of the maximum width d and the aspect ratio h/d are the same as those of the air hole 151.

In the present embodiment, the Al content x of the regrowth interface layer 31A is set to a relatively low value. Furthermore, the aspect ratio h/d is set to be equal to or lower than 1.2. These settings are aimed at helping the material gas for the regrowth interface layer 31 to enter the air holes 151 in the process of creating the regrowth interface layer 31A. The reason for setting the lower limit of the aspect ratio h/d, which is 0.1 in the present case, is because the two-dimensional periodic structure of the air holes 151 may become insufficient if h is too small or d is too large.

A method of producing the two-dimensional photonic crystal laser 10C of the present embodiment is hereinafter described by means of FIGS. 10A-10C. Other examples of the second mode of the method of producing a two-dimensional photonic crystal laser will be described in more detail in Embodiments 8-10.

First, the first cladding layer 12, the active layer 13, the carrier-blocking layer 14 and the two-dimensional photonic crystal layer 15 are created on the substrate 11 by a method similar to Embodiment 1 (FIG. 10A). At this stage, the two-dimensional photonic crystal layer 15 still has air holes 151, similar to the one created in Embodiment 1; the modified refractive index members 32 are not yet formed therein. Next, the regrowth interface layer 31A and the modified refractive index members 32 are simultaneously created on the two-dimensional photonic crystal layer 15 and in the air holes 151, respectively, by epitaxially growing them by a gas-phase process (FIG. 10B). In this process, the modified refractive index members 32 can be created without any voids since, as explained previously, the material gas can easily enter the air holes 151. Furthermore, the aforementioned choice of the material for the base-body layer 152 prevents the occurrence of atomic migration in this process. Subsequently, the second cladding layer 16 is created by epitaxially growing it on the regrowth interface layer 31A by a gas-phase process (FIG. 10C). After that, the contact layer 17, the lower electrode 18 and the upper electrode 19 are created by a method similar to Embodiment 1 to obtain the two-dimensional photonic crystal laser 10C of the present embodiment.

Embodiment 5

Embodiment 5 of the two-dimensional photonic crystal laser according to the present invention is hereinafter described by means of FIG. 11. In the two-dimensional photonic crystal laser 10D of the present embodiment, the two-dimensional photonic crystal layer 15D has a structure composed of columnar modified refractive index members 32A periodically arranged on the carrier-blocking layer 14 and a base body 152B filling the spaces around the modified refractive index members 32A. In the present embodiment, the material of the modified refractive index members 32A is not limited to $Al_xGa_{1-x}As$ ($0<x<=0.8$) but may be another kind of semiconductor or dielectric material. Additionally, a regrowth interface layer 31B made of the same material as that of the base body 152E is formed on the two-dimensional photonic crystal layer 15D. The other elements are the same as those of Embodiment 1.

A method of producing the two-dimensional photonic crystal laser 10D of the present embodiment is hereinafter described by means of FIGS. 12A-12D. First, the first cladding layer 12, the active layer 13 and the carrier-blocking layer 14 are created on the substrate 11 by a method similar to Embodiment 1 (FIG. 12A). Next, a precursor layer 33 for the modified refractive index areas, which is made of a material for the modified refractive index members 32A, is created by epitaxially growing it on the carrier-blocking layer 14 by a gas-phase process (FIG. 12A). Subsequently, the precursor layer 33 is removed from the top surface to a middle depth by electron beam lithography and etching, leaving a group of periodically arranged columnar areas. As a result, columnar modified refractive index members 32A are formed on a spacer layer 33 formed by the remaining bottom portion of the precursor layer 33 (FIG. 12B). Next, the base body 152B is created by epitaxially growing it on the spacer layer 33A by a gas-phase process. The creation of the crystal by epitaxial growth is continued even after the base body 152B has reached the level of the top faces of the modified refractive index members 32A. In this manner, the regrowth layer 31B is formed above the modified refractive index members 32A and the base body 152B (FIG. 12C). Subsequently, the second cladding layer 16 is created by epitaxially growing it on the regrowth interface layer 31B by a gas-phase process (FIG. 12D). After that, the contact layer 17, the lower electrode 18 and the upper electrode 19 are created by a method similar to Embodiment 1 to obtain the two-dimensional photonic crystal laser 10D of the present embodiment.

The two-dimensional photonic crystal laser according to the present invention is not limited to Embodiments 1-5. For example, the base-body layer may be composed of two or more layers made of different materials. Furthermore, one of those layers may be made of GaAs which contains no Al. Even this configuration can more effectively suppress the influence of atomic migration than the configuration in which the base-body layer is entirely made of GaAs.

Embodiment 6

Embodiments of the first mode of the method of producing a two-dimensional photonic crystal are hereinafter described. In the following embodiments, basically, the previously described two-dimensional photonic crystal laser as illustrated in FIGS. 1 and 2 are created. To create such a type of two-dimensional photonic crystal laser, it is necessary to form the second cladding layer 16 immediately above the air holes 151 of the two-dimensional photonic crystal layer 15. In recent years, the idea of using an epitaxial method of forming a layer on the two-dimensional photonic crystal layer 15 has been proposed. However, using a conventional method to implement this idea causes the problem that the air holes 151 become partially filled during the regrowth process and deformed, as shown in FIG. 13. The first mode of the method of producing a two-dimensional photonic crystal laser is characterized in that, in the process of forming the epitaxial layer (second cladding layer) 16 on the two-dimensional photonic crystal layer 15, the shape of the air holes 151 of the two-dimensional photonic crystal layer 15 before the regrowth is designed taking into account the characteristics of the material of the epitaxial layer 16 (this material is hereinafter referred to as the "regrowth material") so as to make the shape of the air holes after the regrowth as close to the desired shape as possible and thereby maintain the performance of the crystal layer 15 as a photonic crystal at high levels.

Initially, one example of the first mode of the method of producing a two-dimensional photonic crystal laser is described with reference to experimental data. In the following description, a material selected from the group of $Al_\alpha Ga_{1-\alpha}As$ ($0<\alpha<1$) or $(Al_\beta Ga_{1-\beta})_\gamma In_{1-\gamma}P$ ($0<=\beta<1$, $0<\gamma<1$) is used for the base-body layer 152. This is because, in the process of forming the epitaxial layer 16 on the two-dimensional photonic crystal layer 15 after a photonic crystal structure has been formed, the substrate must be heated to approximately 600° C., and if the substrate is made of GaAs or a similar material, the air holes 151 may be disfigured due to atomic migration during the heating process. Meanwhile, a material selected from the $Al_xGa_{1-x}As$ group is use as the regrowth material. Materials belonging to the $Al_xGa_{1-x}As$ group have the characteristic that its gas-diffusion length of decreases as the value of x increases, making this material less likely to enter the air holes 151. Accordingly, $Al_xGa_{1-x}As$ can be suitably used as the material for the epitaxial layer 16 to be formed on the two-dimensional photonic crystal layer 15.

The experiments described below were carried out under the conditions that the air holes 151 had a circular planer shape and the value of x was 0.65.

[Experiment on Vertical Sectional Shape]

FIGS. 14A-14C show experimental data on the vertical sectional shape of the air holes 151 before regrowth and that of the air holes 151B after the regrowth. The definitions of the maximum width d and the depth h of the air holes are as already explained in Embodiment 3 (see FIGS. 7A and 7B).

A comparison between FIGS. 14A and 14B demonstrates that, for approximately the same value of d, the vertical sectional shape of the air holes 151 before the regrowth can be maintained to a greater extent by increasing the aspect ratio h/d. On the other hand, a comparison between FIGS. 14B and 14C demonstrates that, for approximately the same value of h/d, the vertical sectional shape of the air holes 151 before the regrowth can be maintained to a greater extent by increasing the maximum width d. These results suggest that it is possible to make the vertical sectional shape of the air holes 151B after the regrowth closer to the shape of the air holes 151 before the formation of the epitaxial layer 16 by appropriately determining one or both of the maximum width d and the aspect ratio h/d of the air holes for the Al content rate x of the regrowth material.

It has been experimentally confirmed that the parameters x, d and h/d should preferably be set within the ranges of $0.4 \leq x<1$, $d \leq 200$ nm and $1.3 \leq h/d$, respectively. It is basically unnecessary to specify the upper limit of the aspect ratio h/d. However, in the present embodiment, an upper limit of 5 is given to the aspect ratio h/d. This is because the two-dimensional periodic structure of the air holes 151 may become insufficient if h is too large or d is too small.

Inside the air hole 151, a diffracted light from the active layer 13 and a diffracted light from the second cladding layer 16 constructively or destructively interfere with each other. The interference condition depends on the material of the base-body layer 152, the depth h of the air hole 151 and the vertical sectional shape of the air hole 151. For example, a constructive interference occurs when the base-body layer 152 is made of $Al_{0.1}Ga_{0.9}As$ and the air hole 151 has a rectangular vertical sectional shape with a depth h=120 nm. If the depth h is further increased, the interference will gradually change from the constructive state toward the destructive one.

Figure 15:
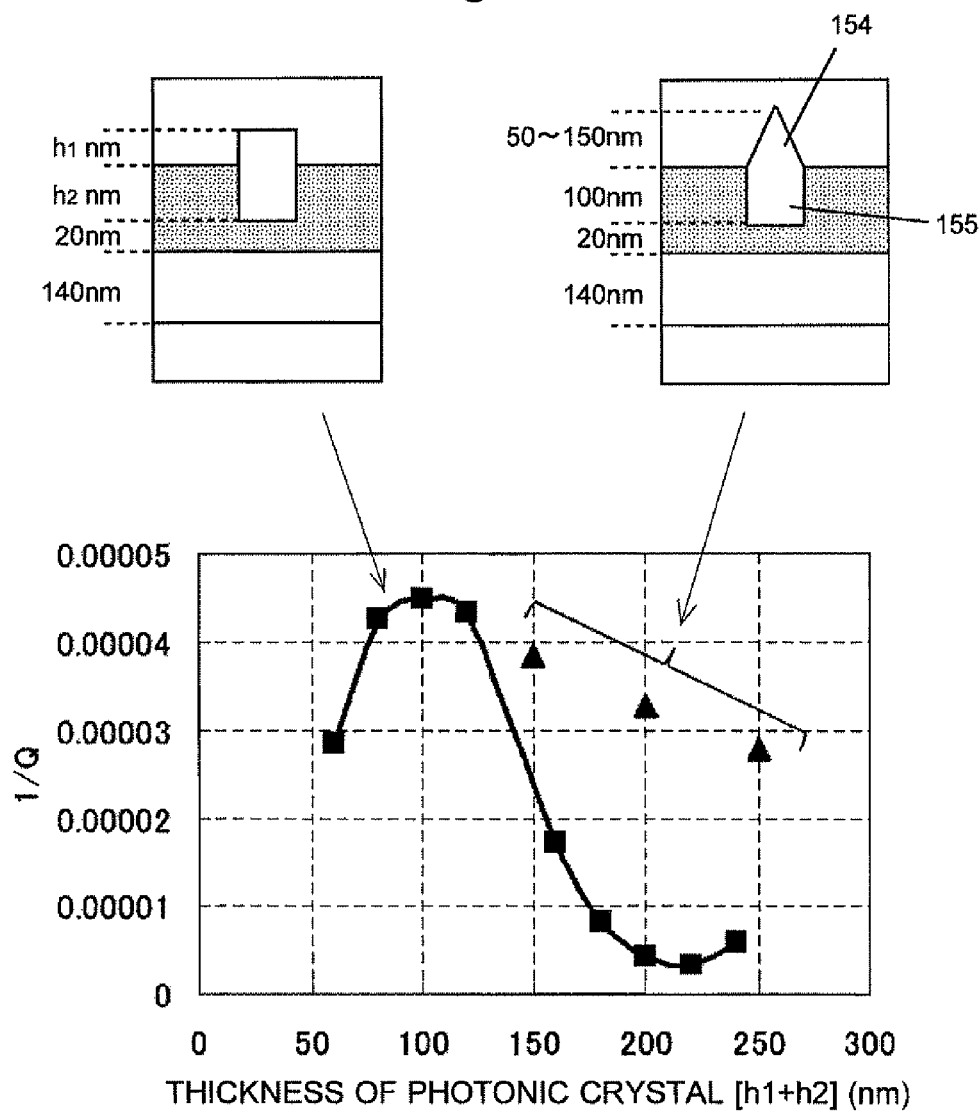
FIG. 15 is a graph showing a change in the effect of interference inside the air holes formed in a two-dimensional photonic crystal layer.

In the regrowth method of the present embodiment, as shown in FIGS. 14A-14C, a bullet-like vertical sectional shape pointing toward the second cladding layer (epitaxial layer) 16 is obtained. FIG. 15 shows how the effect of the interference occurring in the air hole changes depending on the vertical sectional shape of the air hole. When the vertical sectional shape has an upward-tapering conical area 154, the diffracted light from the second cladding layer 16 becomes weaker and the interference becomes less effective, as shown in the graph of FIG. 15.

The result shown in FIG. 15 demonstrates that the effect of the interference can be reduced by changing the depth $h_1$ of the conical area 154 and the depth $h_2$ of the rectangular portion 155. Since the depth $h_1$ of the conical area 154 and the depth $h_2$ of the rectangular portion 155 can be controlled through the parameters d, h and x, it is possible to prevent destructive interference of the diffracted light from the active layer 13 and the diffracted light from the second cladding layer 16 by appropriately adjusting the parameters d, h and x.

[Experiment on Planer Shape (Horizontal Sectional Shape)]

Experimental data on the planer shape of the air holes 151 before the regrowth and that of the air holes 151B after the regrowth are shown in FIGS. 16A-17D.

FIGS. 16A-16E show the result of an experiment on the growth of the epitaxial layer 16 in the in-plane direction (i.e. the direction perpendicular to the stacking direction) on the two-dimensional photonic crystal layer 15. More specifically, FIG. 16A is an electron microscopic image of air holes 151 before the formation of the epitaxial layer 16. FIGS. 16B-16D are electron microscopic images taken when $Al_{0.65}Ga_{0.35}As$ was epitaxially regrown to a thickness of 40 nm on the two-dimensional photonic crystal layer 15, where FIG. 16B shows an image taken from above, FIG. 16C shows a vertical section at a plane perpendicular to an orientation-flat (001) face, and FIG. 16D shows a vertical section at a plane parallel to the orientation-flat (001) face.

In the example of FIGS. 16A-16E, $Al_xGa_{1-x}As$ more easily grows in the direction parallel to the orientation-flat (001) face. Therefore, while the epitaxial layer 16 is being formed, the circular air hole 151 will gradually change to an elliptic hole with its minor diameter extending parallel to the orientation-flat (001) face. Taking this nature into account, the rate of growth in each direction is determined for each value of the Al content rate x of the regrowth material, for example, by a preliminary experiment. Based on the result of this experiment, the planer shape of the air hole 151 before the regrowth can be designed so that the air hole 151B after the regrowth will have the desired planer shape. For example, when x=0.65, the ratio between the growth rate a in the direction parallel to the orientation-flat (001) face to the growth rate b in the direction perpendicular to the orientation-flat (001) face is b/a=1.3. In this case, the desired planer shape will be eventually obtained by giving the air hole 151 before the regrowth an elliptic planer shape having the major diameter extending parallel to the orientation-flat (001) face and the minor diameter extending perpendicular to the same face, with the ratio of the major diameter a to the minor diameter b being a/b=1.3 (FIG. 16E).

When the air hole 151 has a polygonal planer shape, such as a triangle, the crystal grows inward from each side of the polygon. FIGS. 17A-17D show experimental data for various air holes 151 each having an equilateral-triangular planer shape. As in these cases, when the two neighboring growth faces make an angle equal to or smaller than 90°, the crystal grows while gradually filling each vertex of the polygon. Therefore, in the case of FIG. 17A, the planer shape of the air holes 151B after the regrowth has become nearly circular. Taking this into account, in the examples of FIGS. 17B-17D, a groove-like projected portion 153 is formed at each vertex where the two growth faces meet so that the air holes 151B after the regrowth will have a triangular planer shape.

Figure 18A:
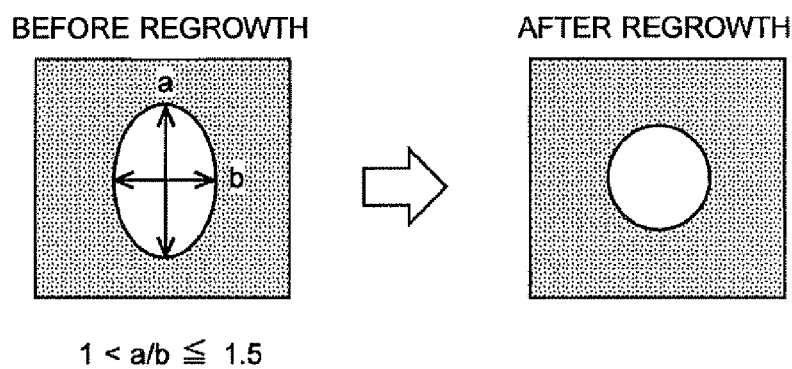
FIGS. 18A and 18B are diagrams each of which shows the horizontal sectional shape of an air hole before regrowth, each air hole being specifically designed so that it will have a circular or equilateral-triangular horizontal sectional shape after the regrowth.
Figure 18B:
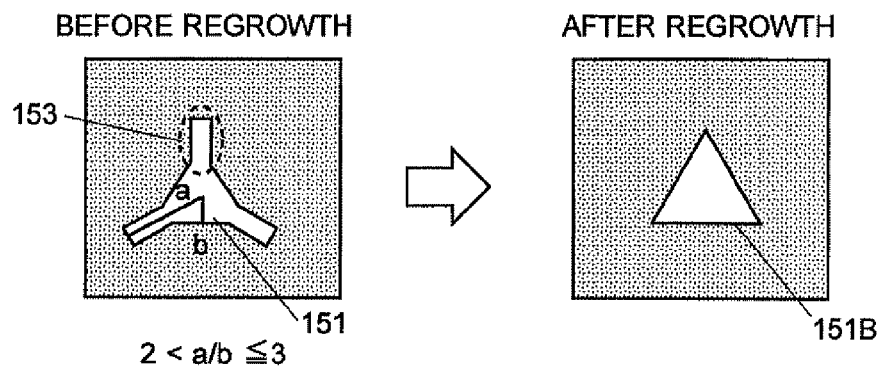

FIGS. 18A and 18B show the results of experiments for circular and equilateral-triangular planer shapes. The experiment for the circular shape has demonstrated that the planer shape after the regrowth will be a circle when the air hole before the regrowth has an elliptic planer shape, with the major diameter extending parallel to the growth face and the minor diameter extending perpendicular to the same face, and the ratio of the major diameter a to the minor diameter b satisfying $1<a/b \leq 1.5$ (FIG. 18A). The experiment for the equilateral-triangular shape has demonstrated that the planer shape after the regrowth will be an equilateral triangle when the air hole before the regrowth has a equilateral-triangular planer shape having a projected portion at each vertex, with the length a of the line segment from the center of gravity of the triangle to the end of the projected portion and the length b of a perpendicular from the center of gravity to each side of the triangle satisfying $2<a/b \leq 3$ (FIG. 18B). In this manner, it is possible to make the planer shape of the air hole after the regrowth close to the desired shape by appropriately changing the shape of the air hole before the regrowth with respect to the direction of the growth face as well as the Al content rate x of the regrowth material.

Embodiment 7

One embodiment of the method of producing a two-dimensional photonic crystal laser according to the present invention is hereinafter described by means of FIGS. 19A-19D.

Figure 19A:
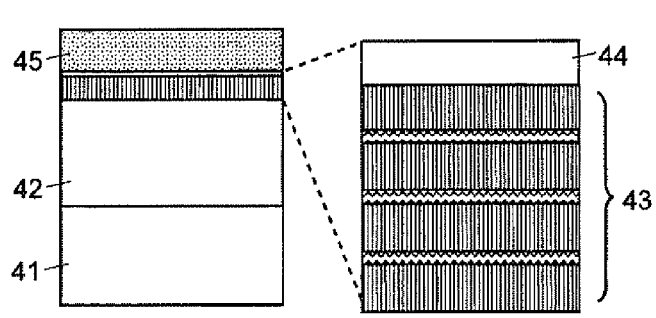
FIGS. 19A-19D are diagrams showing one embodiment of the first mode of the method of producing a two-dimensional photonic crystal laser according to the present invention.
Figure 19B:
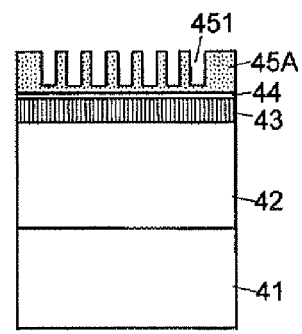
Figure 19C:
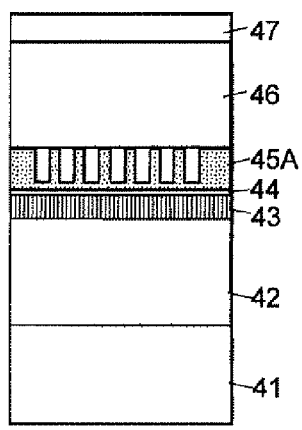
Figure 19D:
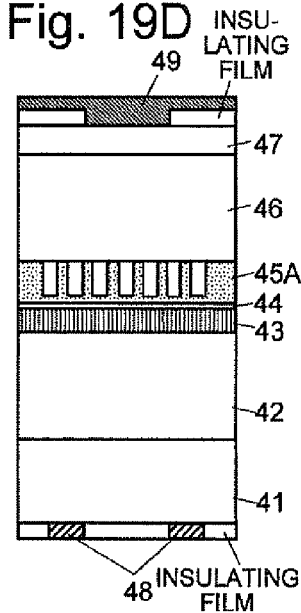

First, an n-type $Al_{0.65}Ga_{0.35}As$ layer (n-type cladding layer) 42, an InGaAs/GaAs layer (active layer) 43, an $Al_{0.4}Ga_{0.6}As$ layer (carrier-blocking layer) 44 and an $Al_{0.1}Ga_{0.9}As$ layer 45 are epitaxially grown in this order on a GaAs substrate 41 (FIG. 19A). Next, a group of air holes 451 with a predetermined periodic structure is created in the $Al_{0.1}Ga_{0.9}As$ layer 45 by etching in such a manner that the maximum width d of the air hole satisfies d<=200 nm and the ratio of the depth h to the maximum width d satisfies 1.3<=h/d<=5 (FIG. 19B). As a result, a two-dimensional photonic crystal layer 45A is obtained. Subsequently, a p-type $Al_{0.65}Ga_{0.35}As$ layer (p-type cladding layer) 46 is created by epitaxially growing it on the two-dimensional photonic crystal layer 45A (i.e. the $Al_{0.1}Ga_{0.9}As$ layer 45 with the air holes 451 formed therein), after which a p-type GaAs layer (contact layer) 47 is formed on the p-type $Al_{0.65}Ga_{0.35}As$ layer 46 (FIG. 19C). After that, a lower electrode (window-shaped electrode) 48 and an upper electrode 49 are formed under the substrate 41 and on the p-type GaAs layer 47, respectively (FIG. 19D). As a result, a two-dimensional photonic crystal laser with high laser characteristics is obtained. It should be noted that the base body of the two-dimensional photonic crystal layer 45A may be made of a material selected from the group of $(Al_\beta Ga_{1-\beta})_\gamma In_{1-\gamma}P$ ($0<=\beta<1$, $0<\gamma<1$).

Although the planer shape of the air holes 451 before the regrowth is not specified in the above method, it is preferable to appropriately design their planer shape based on the growth face of the p-type $Al_{0.65}Ga_{0.35}As$ layer 46 during the epitaxial growth of this layer, as shown in FIGS. 16A-18B, so as to improve the performance of the two-dimensional photonic crystal layer 45A and thereby achieve high laser characteristics.

In the method shown in FIGS. 19A-19D, a process for forming a growth-inhibiting film made of a material that can inhibit the epitaxial growth of the materials of the $Al_x Ga_{1-x}As$ group may be added between the processes of FIGS. 19B and 19C. Examples of the growth-inhibiting materials include $SiO_2$, $Si_3N_4$, ZnO and $ZrO_2$. This variation is hereinafter described by means of FIGS. 20A-20D.

Figure 20A:
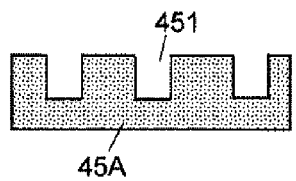
FIGS. 20A-20D are diagrams showing a variation of the first mode of the method of producing a two-dimensional photonic crystal laser.
Figure 20B:
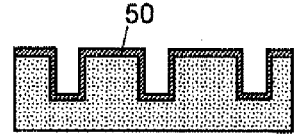
Figure 20C:
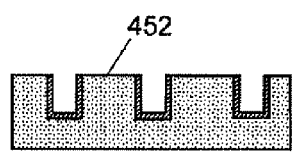
Figure 20D:
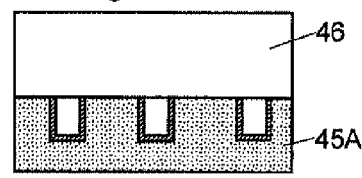

After, the air holes 451 have been formed in the $Al_{0.1}Ga_{0.9}As$ layer 45A (FIG. 20A), an $SiO_2$ film 50 is formed on this layer (FIG. 20B). Next, the $SiO_2$ film 50 is removed by dry etching (FIG. 20C). Since the etching rate on the surface 452 of the $Al_{0.1}Ga_{0.9}As$ layer 45A is higher than in the air holes 451, the $SiO_2$ film 50 remains only in the air holes 451. The $SiO_2$ film 50 remaining in the air holes 451 functions as a growth-inhibiting film for inhibiting the epitaxial growth of $Al_xGa_{1-x}As$. Accordingly, the formation of the crystal in the air holes 451 during the epitaxial growth of the p-type cladding layer 46 is more effectively prevented.

In the case of forming the growth-inhibiting film in the air holes 451, it is desirable to design the vertical and/or horizontal sectional shape of the air holes 451 before the regrowth by the previously described method, although the laser characteristics can be considerably improved by merely forming the growth-inhibiting film in the air holes 451.

Embodiments 6 and 7 are mere examples of the first mode of the method of producing a two-dimensional photonic crystal laser, and any change, modification or addition may be appropriately made within the spirit of the present invention. For example, in the aforementioned embodiments, the base-body layer had a one-layer structure made of $Al_{0.1}Ga_{0.9}As$. This can be changed to a multi-layer structure having a plurality of $Al_\alpha Ga_{1-\alpha}As$ layers with different values of α. This structure may be further modified by replacing a portion of the layers with a GaAs layer or another kind of semiconductor layer. Similarly, when a material of the $(Al_{62}Ga_{1-\beta})_\gamma In_{1-\gamma}P$ group is used for the base-body layer, it is possible to adopt a multi-layer structure having a plurality of layers with different values of β and γ, and to further modify this structure by replacing a portion of the layers with a GaAs layer or another kind of semiconductor layer.

Embodiment 8

Figure 21:
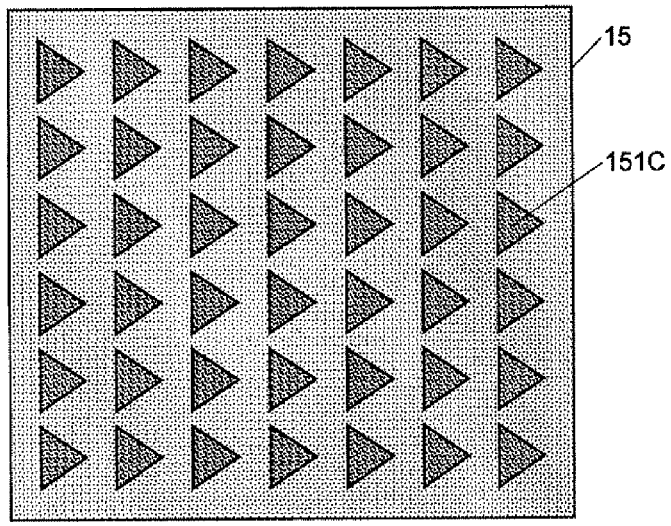
FIG. 21 is a top view showing the structure of a two-dimensional photonic crystal layer formed by the second or third mode of the method of producing a two-dimensional photonic crystal laser according to the present invention.

Embodiments 8-10 are examples of the second mode of the method of producing a two-dimensional photonic crystal laser. The basic structure of the two-dimensional photonic crystal laser created by the second-mode method is the same as shown in FIG. 1. An important difference is that, in place of the air holes, modified refractive index members made of a material different from that of the base body are used as the modified refractive index areas 151C (FIG. 21). The structure using the modified refractive index members as the modified refractive index areas has a lower light-confining effect as compared to the structure using air holes. However, the former structure is advantageous in that a single-mode laser oscillation can be more easily generated over a large area.

Figure 22A:
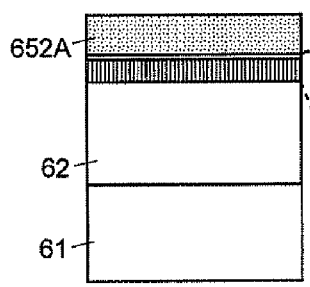
FIGS. 22A-22D are vertical sectional views showing one embodiment (Embodiment 8) of the second mode of the method of producing a two-dimensional photonic crystal laser according to the present invention.
Figure 22B:
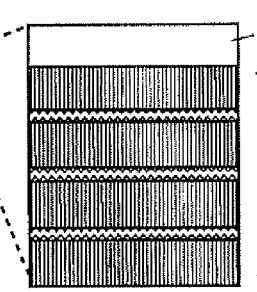
Figure 22C:
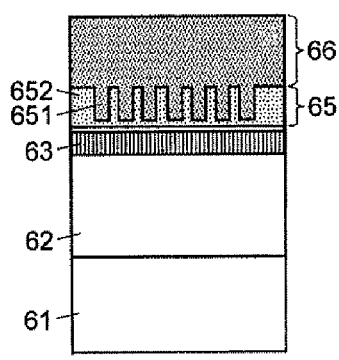
Figure 22D:
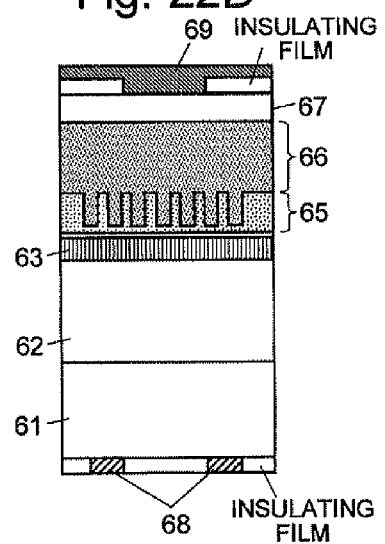

The production method according to Embodiment 8 is hereinafter described by means of FIGS. 22A-22D. First, a first cladding layer 62 made of n-type $Al_{0.4}Ga_{0.6}As$, an active layer 63 made of InGaAs/GaAs multiple quantum wells, a carrier-blocking layer 64 made of $Al_{0.4}Ga_{0.6}As$, and a base-body layer 652A made of $Al_{0.1}Ga_{0.9}As$ are created in this order on a substrate 61 by an epitaxial method (FIG. 22A). Next, a large number of air holes 651 having a circular planer shape with the diameter (maximum width) d being 110 nm, the depth h being 120 nm, and hence the aspect ratio h/d being 1.09, are periodically formed at predetermined space intervals in the base-body layer 652A by electron beam lithography and etching (FIG. 22B). Subsequently, a crystal of p-type $Al_{0.4}Ga_{0.6}As$ is epitaxially grown in the air holes 651A and on the base-body layer 652A (FIG. 22C). In this process, modified refractive index areas 651 made of p-type $Al_{0.4}Ga_{0.6}As$ are formed in the air holes 651A, whereby a two-dimensional photonic crystal layer 65 composed of the base-body 652 and the modified refractive index areas 651 is created. Simultaneously, a second cladding layer 66 made of p-type $Al_{0.4}Ga_{0.6}As$ is created on the two-dimensional photonic crystal layer 65. Subsequently, a lower electrode (window-shaped electrode) 68 is formed under the substrate 61, while a contact layer 67 and an upper electrode 69 are formed in this order on the second cladding layer 66 (FIG. 22D). Thus, the two-dimensional photonic crystal laser is completed.

The materials of the layers are not limited to the aforementioned ones. For example, $Al_xGa_{1-x}As$ ($0<x<=0.8$) may be used as the material for the modified refractive index areas 651 and the second cladding layer 66. This material has the characteristic that, as the content rate of Al decreases, the molecules of the material gas used in the creation process more easily diffuse, thereby helping the material to enter the air holes 651. As the material for the base-body layer 652A, $Al_\alpha Ga_{1-\alpha}As$ ($0<\alpha<1$, where $\alpha \neq x$) or $(Al_\beta Ga_{1-\beta})_\gamma In_{1-\gamma}P$ ($0<=\beta<1$, $0<\gamma<1$) having the same crystal structure as that of the material of the modified refractive index areas 651 may be used.

The planer shape of the air hole 651A (and the modified refractive index area 651 created by filling the air hole 651A with the modified refractive index member) is not limited to a circle; there are various choices, such as an ellipse or triangle. The maximum width d and the aspect ratio h/d are not limited to the aforementioned values; a sufficient amount of gas molecules will reach the bottom of the air hole 651A as long as these parameters satisfy the conditions of d<=200 nm and 0.1<=h/d<=1.2. The definitions of the maximum width d and the depth h of the air holes are as already explained in Embodiment 3 (see FIGS. 7A and 7B).

FIGS. 23A and 23B are electron microscopic images showing the results of an experiment in which a crystal of p-type $Al_{0.4}Ga_{0.6}As$ was epitaxially grown in the air holes 651A by the method of Embodiment 8. In this experiment, the crystal growth was discontinued when the crystal of p-type $Al_{0.4}Ga_{0.6}As$ reached the thickness of 50 nm. Two types of air holes 651A were created in this experiment; the first type measured d=130 nm, h=60 nm and h/d=0.46 (FIG. 23A), while the second type measured d=130 nm, h=80 nm, and h/d=0.63 (FIG. 23B). The obtained electron microscopic images demonstrate that the air holes 651A were filled without any voids after the crystal growth.

Embodiment 9

Figure 24A:
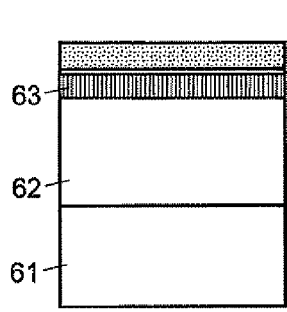
FIGS. 24A-24E are vertical sectional views showing one embodiment (Embodiment 9) of the second mode of the method of producing a two-dimensional photonic crystal laser.
Figure 24B:
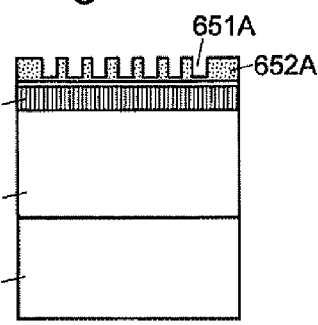
Figure 24C:
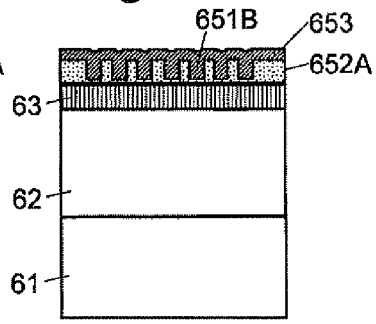
Figure 24D:
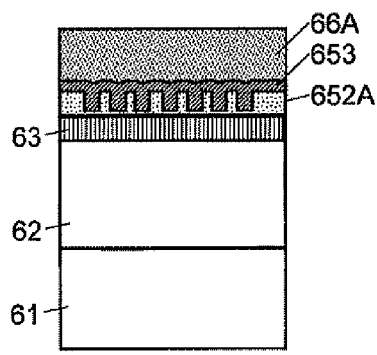
Figure 24E:
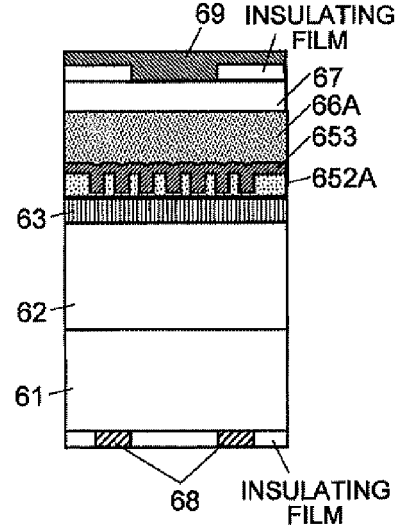

Another embodiment of the second mode of the method of producing a two-dimensional photonic crystal laser is hereinafter described by means of FIGS. 24A-24E. In the present embodiment, the modified refractive index areas and the second cladding layer are respectively created by separate processes. First, the first cladding layer 62, the active layer 63, the carrier-blocking layer 64 and the base-body layer 652A are formed in this order on the substrate 61 (FIG. 24A), using the same method and materials as used in Embodiment 1, after which the air holes 651A are formed in the base-body layer 652A (FIG. 24B). Next, modified refractive index areas 651B are formed in the air holes 651A by growing a crystal of $Al_yGa_{1-y}As$ ($0 \leq y \leq 1$) in the air holes 651A by an epitaxial method until the air holes 651A are entirely filled (FIG. 24C). In this process, a buffer layer 653 made of $Al_{0.4}Ga_{0.6}As$ is also created on the base-body layer 652A. Subsequently, the second cladding layer 66A made of p-type $Al_{0.4}Ga_{0.6}As$ is created on the buffer layer 653 by an epitaxial method (FIG. 24D). After that, similarly to Embodiment 8, the lower electrode 68, the contact layer 67 and the upper electrode 69 are formed (FIG. 24E) to complete the two-dimensional photonic crystal laser.

Embodiment 10

Figure 25A:
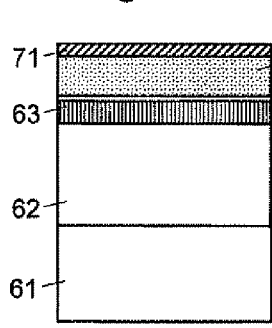
FIGS. 25A-25E are vertical sectional views showing one embodiment (Embodiment 10) of the second mode of the method of producing a two-dimensional photonic crystal laser.
Figure 25B:
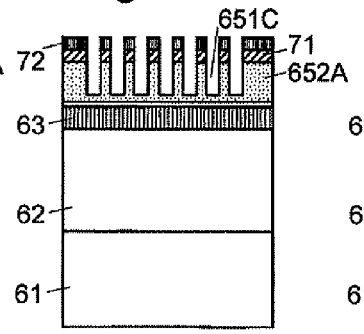
Figure 25C:
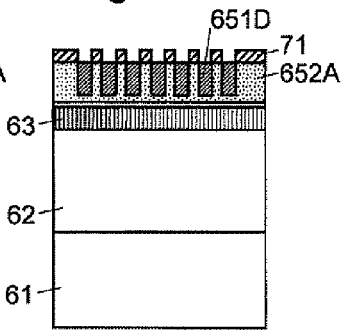
Figure 25D:
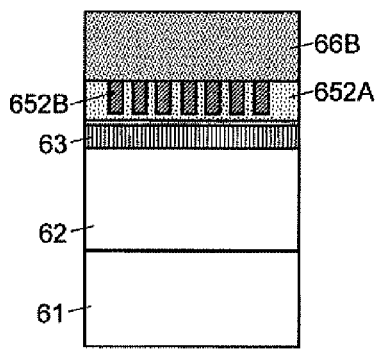
Figure 25E:
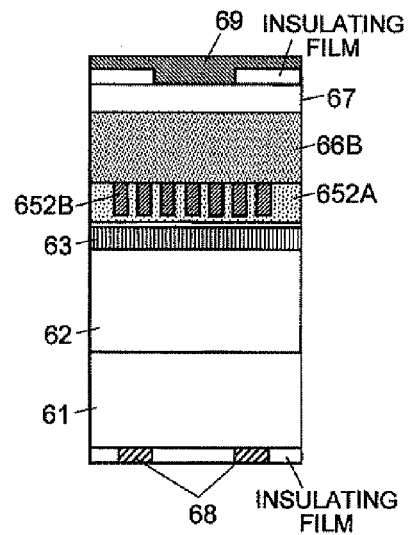

Another embodiment of the second mode of the method of producing a two-dimensional photonic crystal laser is hereinafter described by means of FIGS. 25A-25E. First, the first cladding layer 62, the active layer 63, the carrier-blocking layer 64 and the base-body layer 652A are formed in this order on the substrate 61, using the same method and materials as used in Embodiment 8, after which a crystal-growth inhibiting film 71 made of $SiO_2$ is formed on the base-body layer 652A (FIG. 25A). $SiO_2$ is a material capable of inhibiting the epitaxial growth of $Al_xGa_{1-x}As$ (x=0.4 in the present embodiment) used for forming the modified refractive index areas. It is also possible to use $Si_3N_4$, ZnO or $ZrO_2$ as the material for the crystal-growth inhibiting film 71. Next, a pattern of a resist 72 for masking the areas other than the modified refractive index areas is formed by electron beam lithography, and an etching process using an etchant capable of removing the crystal-growth inhibiting film 71 is carried out. After that, another etching process using a different etchant is performed for the base-body layer 652A. As a result, air holes 651C which penetrate through the crystal-growth inhibiting film 71 to the base-body layer 652A are created (FIG. 25B). Subsequently, after the resist 72 is removed, the modified refractive index areas 651D made of $Al_xGa_{1-x}As$ is created by forming a crystal of $Al_xGa_{1-x}As$ in the air holes 651C by an epitaxial method (FIG. 25C). In this process, the epitaxial growth of $Al_xGa_{1-x}As$ does not occur on the portions of the top surface of the base-body layer 652A where no air holes 651C exist, because the crystal-growth inhibiting film 71 still remains on those portions. In this manner, the crystal of $Al_xGa_{1-x}As$ is prevented from horizontally extending from the top surface of the base-body layer 652 and closing the air holes 651C, so that no void will be formed inside the modified refractive index areas 651D. Next, the crystal-growth inhibiting film 71 is removed, and the second cladding layer 66B made of p-type $Al_{0.4}Ga_{0.6}As$ is created on the base-body layer 652A and the modified refractive index areas 651D by an epitaxial method (FIG. 25D). After that, similarly to Embodiment 8, the lower electrode 68, the contact layer 67 and the upper electrode 69 are formed (FIG. 25E) to complete the two-dimensional photonic crystal laser.

Embodiment 11

Figure 26A:
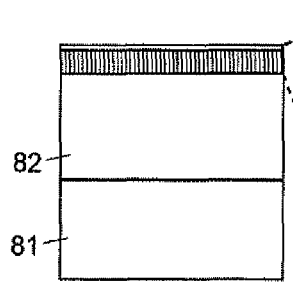
FIGS. 26A-26F are vertical sectional views showing one embodiment (Embodiment 11) of the third mode of the method of producing a two-dimensional photonic crystal laser according to the present invention.
Figure 26B:
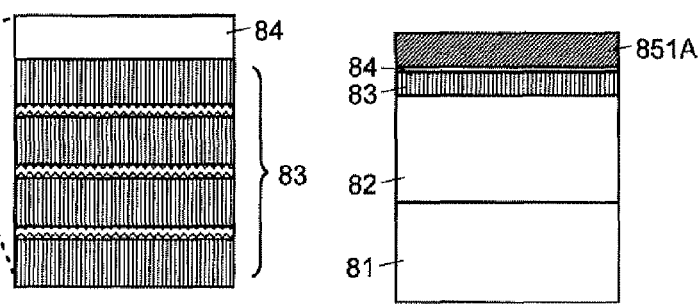
Figure 26C:
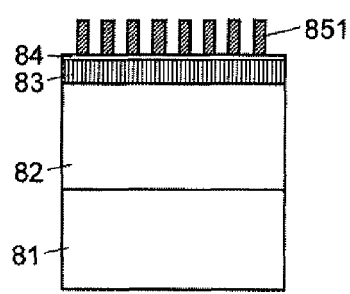
Figure 26D:
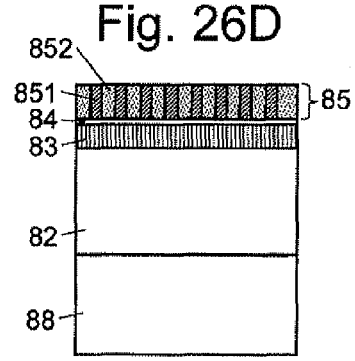
Figure 26E:
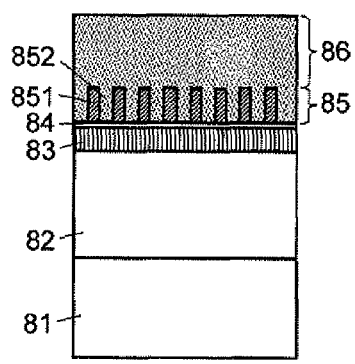
Figure 26F:
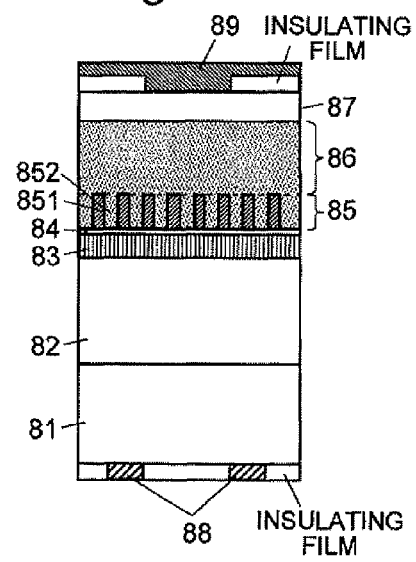

Embodiments of the third mode of the method of producing a two-dimensional photonic crystal laser according to the present invention are hereinafter described. Initially, one of the embodiments is described by means of FIGS. 26A-26F. a first cladding layer 82 made of n-type $Al_{0.65}Ga_{0.35}As$, an active layer 83 made of InGaAs/GaAs multiple quantum wells, and a carrier-blocking layer 84 made of $Al_{0.4}Ga_{0.6}As$ are formed in this order on a substrate 81 by an epitaxial method (FIG. 26A). Next, a precursor layer 851A for modified refractive index areas, which layer is made of $SiO_2$, is formed on the carrier-blocking layer 84 by sputtering (FIG. 26B). Subsequently, the precursor layer 851A is partially removed by electron beam lithography and etching, leaving a number of periodically arranged columnar areas. In this manner, columnar modified refractive index areas 851 made of $SiO_2$ are formed on the carrier-blocking layer 84 (FIG. 26C). After that, a base body 852 is formed in the spaces between the modified refractive index areas 851 by epitaxially growing a crystal of p-type $Al_{0.65}Ga_{0.35}As$ on the portions of the carrier-blocking layer 84 from which the precursor layer 851A has been removed (FIG. 26D). In this process, the aforementioned portions of the carrier-blocking layer 84 serve as the substrate (i.e. the epitaxial-growth substrate layer). Thus, a two-dimensional photonic crystal layer 85 having the base body 852 filling the spaces between the modified refractive index areas 851 is created. Since the modified refractive index areas 851 are made of $SiO_2$, the p-type $Al_{0.65}Ga_{0.35}As$ crystal will not grow on the modified refractive index areas 851 until the base body 852 grows to the same level as the modified refractive index areas 851. After the base body 852 has grown to the same level as the modified refractive index areas 851, the growth of the p-type $Al_{0.65}Ga_{0.35}As$ crystal is further continued. Then, the p-type $Al_{0.65}Ga_{0.35}As$ crystal begins to grow not only in the vertical direction but also in the horizontal direction. As a result, a second cladding layer 86 made of p-type $Al_{0.65}Ga_{0.35}As$ is formed over the two-dimensional photonic crystal layer 85, including the top faces of the modified refractive index areas 851 (FIG. 26E). After that, similarly to Embodiment 8, a lower electrode 88 is formed under the substrate 81, while a contact layer 87 and an upper electrode 89 are formed in this order on the second cladding layer 86 (FIG. 26F). Thus, the two-dimensional photonic crystal laser is completed.

In the present embodiment, there is no specific limitation on the size (aspect ratio) of the modified refractive index area 851. Furthermore, the materials of the layers are not limited to the aforementioned ones. For example, $Si_3N_4$, ZnO or $ZrO_2$ may be used as the material for the modified refractive index areas 851 (and the precursor layer 851A for modified refractive index areas). $Al_xGa_{1-x}As$ ($0<x<=0.65$) may be used as the material for the base body 852 and the second cladding layer 86. The shape of the modified refractive index area 851 is not limited to a column; there are various choices, such as an elliptical column or triangular prism.

Figure 27A:
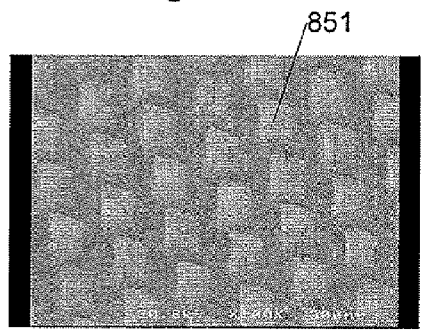
FIG. 27A is an electron microscopic image of the modified refractive index areas 851 taken in one production step (FIG. 26C) of Embodiment 11.
Figure 27B:
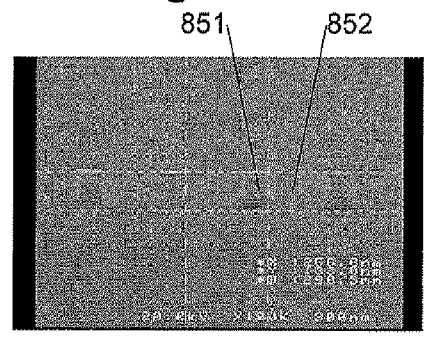
FIG. 27B is an electron microscopic image of a vertical section of the two-dimensional photonic crystal laser produced in Embodiment 11.

FIG. 27A is an electron microscopic image of the precursor layer 851A for modified refractive index areas, which image was taken immediately after the etching of that layer (corresponding to FIG. 26C). This image demonstrates that a large number of modified refractive index areas 851 in the form of triangular prisms were formed. FIG. 27B is an electron microscopic image showing a vertical section of the two-dimensional photonic crystal laser created in the present embodiment, which image was taken after the completion of the laser. This image demonstrates that the base body 852 was solidly formed (without any void) around the modified refractive index areas 851.

In the case of creating the base body 852 using a material different from that of the second cladding layer 86, the material supplied to the surface of the modifier refractive index areas 851 and the base body 852 is changed to a material for the second cladding layer 86 after the base body 852 has grown to the same level as the modified refractive index areas 851 (FIG. 26D).

Embodiment 12

Figure 28A:
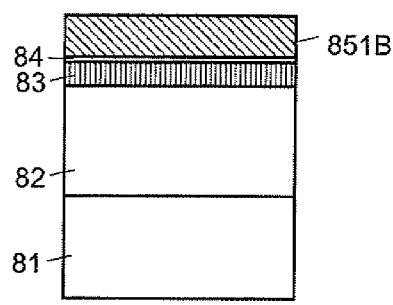
FIGS. 28A-28D are vertical sectional views showing one embodiment (Embodiment 12) of the third mode of the method of producing a two-dimensional photonic crystal laser.
Figure 28B:
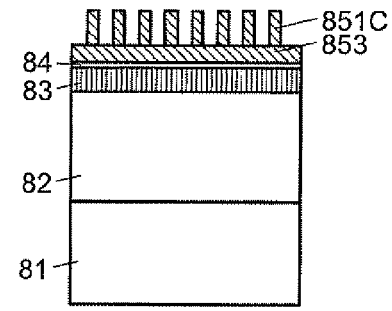
Figure 28C:
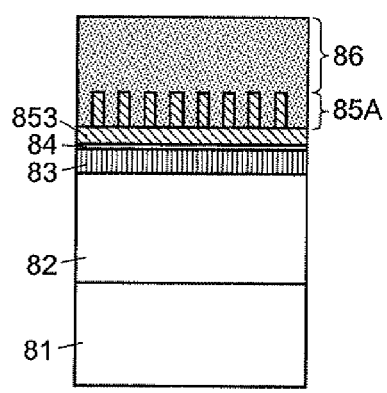
Figure 28D:
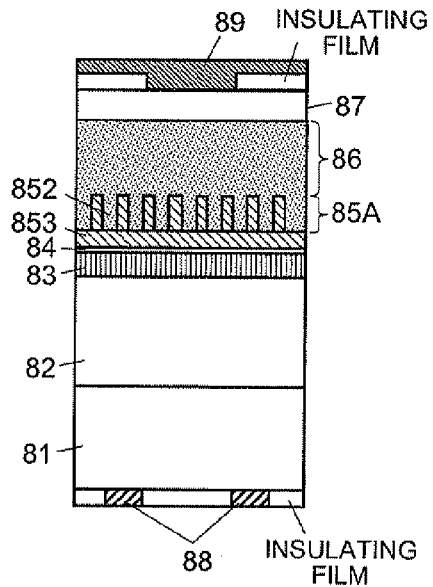

Another embodiment of the third mode of the method of producing a two-dimensional photonic crystal laser is hereinafter described by means of FIGS. 28A-28D. In the present embodiment, the precursor layer 851B for modified refractive index areas is created by an epitaxial method using a material having the same crystal structure as the base body 852, such as $Al_\alpha Ga_{1-\alpha}As$ ($0<=\alpha<=1$) or $(Al_\beta Ga_{1-\beta})_\gamma In_{1-\gamma}P$ ($0<=\beta<=1$, $0<=\gamma<=1$) (FIG. 28A). After the precursor layer 851B is formed, the precursor layer 851B is partially removed from the top surface to a middle level by electron beam lithography and etching, leaving a group of cyclically arranged columnar areas. As a result, columnar modified refractive index areas 851C are formed on a spacer layer 853 which consists of the remaining bottom portion of the precursor layer 851B (FIG. 28B). Subsequently, using the spacer layer 853 and the modified refractive index areas 851C as the epitaxial-growth substrate layer, the base body 852 and the second cladding layer 86 are created by epitaxially growing a crystal of p-type $Al_{0.65}Ga_{0.35}As$ on the epitaxial-growth substrate layer (FIG. 28C). After that, similarly to Embodiment 11, the lower electrode 88, the contact layer 87 and the upper electrode 89 are formed (FIG. 26D) to complete the two-dimensional photonic crystal laser.

Embodiment 13

Another embodiment of the third mode of the method of producing a two-dimensional photonic crystal laser is hereinafter described by means of FIGS. 29A-29E. First, the first cladding layer 82, the active layer 83, the carrier-blocking layer 84 and the precursor layer 851B for modified refractive index areas are formed in this order on the substrate 81 by an epitaxial method using the same method and materials as used in Embodiment 12. Next, a crystal-growth inhibiting film 91 made of $SiO_2$ is formed on the precursor layer 851B (FIG. 29A). $SiO_2$ is a material capable of inhibiting the epitaxial growth of $Al_xGa_{1-x}As$ ($x=0.65$ in the present embodiment) used for forming the base body. It is also possible to use $Si_3N_4$, ZnO or $ZrO_2$ as the material for the crystal-growth inhibiting film 91. Subsequently, a pattern of a resist 92 for masking the areas corresponding to the modified refractive index areas is formed by electron beam lithography, and an etching process using an etchant capable of removing the crystal-growth inhibiting film 91 is carried out. After that, another etching process using a different etchant is performed for the precursor layer 851B. As a result, modified refractive index areas 851C with the crystal-growth inhibiting film 91 on their top faces are formed (FIG. 29B). Subsequently, the base body 852 is created by epitaxially growing a crystal of p-type $Al_{0.65}Ga_{0.35}As$ on the space layer 853, which is formed by the remaining lower portions of the precursor layer 851B and serves as the epitaxial growth substrate layer (FIG. 29C). In this process, the crystal-growth inhibiting film 91 on the top faces of the modified refractive index areas 851C prevents the p-type $Al_{0.65}Ga_{0.35}As$ crystal from horizontally extending from the top faces of the modified refractive index areas 851C and closing the spaces between the modified refractive index areas 851C, so that no void will be formed inside the base body 852. Next, the crystal-growth inhibiting film 91 is removed, and the second cladding layer 86 made of p-type $Al_{0.65}Ga_{0.35}As$ is created on the modified refractive index areas 851C and the base-body layer 852 by an epitaxial method (FIG. 29D). After that, similarly to Embodiment 11, the lower electrode 88, the contact layer 87 and the upper electrode 89 are formed (FIG. 29E) to complete the two-dimensional photonic crystal laser.

In the present embodiment, after the base body 852 is formed (FIG. 29C), it is possible to create the second cladding layer 86 without removing the crystal-growth inhibiting film 91. In this case, after the crystal of the second cladding layer 86 has grown to a level higher than the crystal-growth inhibiting film 91, the crystal grows not only in the vertical direction but also in the horizontal direction. As a result, the upper surface of the crystal-growth inhibiting film 91 will be covered with the second cladding layer 86. It is also possible to use different materials for the base body 852 and the second cladding layer 86.

The previously described embodiments of the second and third modes are mere examples, and any change, modification or addition may be appropriately made within the spirit of the present invention. For example, in the aforementioned embodiments, the base-body layer had a one-layer structure made of $Al_{0.1}Ga_{0.9}As$. This can be changed to a multi-layer structure having a plurality of $Al_\alpha Ga_{1-\alpha}As$ layers with different values of $\alpha$. This structure may be further modified by replacing a portion of the layers with a GaAs layer or another kind of semiconductor layer. Similarly, when a material selected from the $(Al_\beta Ga_{1-\beta})_\gamma In_{1-\gamma}P$ group is used for the base-body layer, it is possible to adopt a multi-layer structure having a plurality of layers with different values of $\beta$ and $\gamma$, and to further modify this structure by replacing a portion of the layers with a GaAs layer or another kind of semiconductor layer.

EXPLANATION OF NUMERALS

- 10, 10A, 10B, 10C, 10D . . . Two-Dimensional Photonic Crystal Laser
- 11, 41, 61, 81 . . . Substrate
- 12, 62, 82 . . . First Cladding Layer
- 13, 43, 63, 83 . . . Active Layer
- 14, 44, 64, 84 . . . Carrier-Blocking Layer
- 15, 15A, 15C, 15D, 45, 45A, 65, 85 . . . Two-Dimensional Photonic Crystal Layer
- 151, 151A, 151B, 451, 651A, 651C . . . Air Hole 151C . . . Modified Refractive Index Area Consisting of Modified Refractive Index Member
152, 152A, 652A . . . Base-Body Layer
1521A . . . First Base-Body Layer
1522A . . . Second Base-Body Layer
152B, 652, 852 . . . Base Body
16, 66, 66A, 66B, 86 . . . Second Cladding Layer (Epitaxial Growth Layer)
17, 67, 87 . . . Contact Layer
18, 47, 68, 88 . . . Lower Electrode
19, 48, 69, 89 . . . Upper Electrode
21 . . . Resist
31, 31A, 31B . . . Regrowth Interface Layer
32, 32A . . . Modified Refractive Index Member
33, 851A, 851B . . . Precursor Layer for Modified Refractive Index Areas
33A, 853 . . . Spacer Layer
42 . . . n-type Cladding Layer
452 . . . Surface of $Al_{0.1}Ga_{0.9}As$
46 . . . p-type Cladding Layer
50 . . . $SiO_2$ Film
651B, 651D, 851, 851C . . . Modified Refractive Index Areas
653 . . . Buffer Layer
71, 91 . . . Crystal-Growth Inhibiting Film
72, 92 . . . Resist

The invention claimed is:

1. A two-dimensional photonic crystal laser, comprising:
a two-dimensional photonic crystal layer having a base-body layer made of $Al_\alpha Ga_{1-\alpha}As$ (0<a<1) or $(Al_\beta Ga_{1-\beta})_\gamma In_{1-\gamma}P$ (0<=β<1, 0<γ<1) with modified refractive index areas periodically arranged therein;
an epitaxial growth layer created over the two-dimensional photonic crystal layer by an epitaxial method; and
a regrowth interface layer for epitaxially growing the epitaxial growth layer, the regrowth interface layer being disposed between the two-dimensional photonic crystal layer and the epitaxial growth layer,
wherein:
a material of the regrowth interface layer is composed of same elements as a material of the base-body layer of the two dimensional photonic crystal layer and a material of the epitaxial growth layer, while a content rate of Al and Ga of the regrowth interface layer is different from a content rate of Al and Ga of the base-body layer of the two-dimensional photonic crystal layer and the epitaxial growth layer;
a material of the epitaxial growth layer is composed of same elements as the base-body layer of the two-dimensional photonic crystal layer while a content rate of each of the elements of the epitaxial growth layer is different from a content rate of each of the elements of the base-body layer of the two-dimensional photonic crystal layer;
an Al content rate of the regrowth interface layer is higher than an Al content rate of the base-body layer of the two-dimensional photonic crystal layer; and
the modified refractive index areas of the two-dimensional photonic crystal layer are air holes.

2. The two-dimensional photonic crystal layer according to claim 1, wherein the base-body layer has a multi-layer structure having a plurality of layers with different material compositions.

3. The two-dimensional photonic crystal laser according to claim 2, wherein, among the plurality of the layers forming the base-body layer, the nearest layer to the epitaxial growth layer has an Al content rate equal to or less than 0.1.

4. The two-dimensional photonic crystal laser according to claim 2, wherein the base-body layer includes a layer made of GaAs.

5. The two-dimensional photonic crystal laser according to claim 1, wherein the epitaxial growth layer is made of $Al_x Ga_{1-x} As$ (0<x<1).

6. The two-dimensional photonic crystal laser according to claim 1, wherein the modified refractive index areas are areas created by epitaxially growing $Al_x Ga_{1-x} As$ (0<x<1).

7. The two-dimensional photonic crystal laser according to claim 1, wherein a p-type or n-type cladding layer is formed on the epitaxial growth layer.

8. The two-dimensional photonic crystal laser according to claim 1, wherein:
the air hole has a maximum width d in planer shape and a depth h, where d satisfies d<=200 nm and a depth-to-width ratio h/d satisfies 1.3<=h/d<=5; and
the epitaxial growth layer is made of $Al_x Ga_{1-x} As$ (0.4<=x<1).

9. The two-dimensional photonic crystal laser according to claim 8, wherein a vertical sectional shape of the air hole has a conical area.

10. The two-dimensional photonic crystal laser according to claim 2, wherein among the plurality of the layers forming the base-body layer, the nearest layer to the epitaxial growth layer is less oxidized than the other layers forming the base-body layer.

11. The two-dimensional photonic crystal laser according to claim 1, wherein the air holes are areas surrounded by the regrowth interface layer and a concave portion of the two-dimensional photonic crystal layer.

* * * * *